US011154959B2

(12) United States Patent
Lehuu et al.

(10) Patent No.: US 11,154,959 B2
(45) Date of Patent: Oct. 26, 2021

(54) POLISHING PADS AND SYSTEMS AND METHODS OF MAKING AND USING THE SAME

(71) Applicant: 3M INNOVATIVE PROPERTIES COMPANY, St. Paul, MN (US)

(72) Inventors: Duy K. Lehuu, Lake Elmo, MN (US); David F. Slama, City of Grant, MN (US)

(73) Assignee: 3M INNOVATIVE PROPERTIES COMPANY, Saint Paul, MN (US)

( * ) Notice: Subject to any disclaimer, the term of this patent is extended or adjusted under 35 U.S.C. 154(b) by 702 days.

(21) Appl. No.: 15/766,643

(22) PCT Filed: Oct. 7, 2016

(86) PCT No.: PCT/US2016/055908
§ 371 (c)(1),
(2) Date: Apr. 6, 2018

(87) PCT Pub. No.: WO2017/062719
PCT Pub. Date: Apr. 13, 2017

(65) Prior Publication Data
US 2018/0281148 A1    Oct. 4, 2018

Related U.S. Application Data

(60) Provisional application No. 62/266,963, filed on Dec. 14, 2015, provisional application No. 62/238,668, filed on Oct. 7, 2015.

(51) Int. Cl.
*B24B 37/22* (2012.01)
*B24B 37/24* (2012.01)
(Continued)

(52) U.S. Cl.
CPC .............. *B24B 37/22* (2013.01); *B24B 37/24* (2013.01); *B24B 37/245* (2013.01); *B24B 37/26* (2013.01);
(Continued)

(58) Field of Classification Search
CPC ......... B24B 37/14; B24B 37/16; B24B 37/22; B24B 37/24; B24B 37/245; B24B 37/26;
(Continued)

(56) References Cited

U.S. PATENT DOCUMENTS

| 5,152,917 A | 10/1992 | Pieper |
| 5,435,816 A | 7/1995 | Spurgeon |

(Continued)

FOREIGN PATENT DOCUMENTS

| WO | WO 99/06182 A1 | 2/1999 |
| WO | WO 2015-013387 | 1/2015 |

(Continued)

OTHER PUBLICATIONS

International Search Report for PCT International Application No. PCT/US2016/055908, dated Mar. 10, 2017, 6 pages.

*Primary Examiner* — Eileen P Morgan
(74) *Attorney, Agent, or Firm* — Daniel J. Iden

(57) ABSTRACT

The present disclosure relates to polishing pads which include a polishing layer, a porous substrate and an interfacial region. The present disclosure relates to a method of making the polishing pads. The present disclosure relates to a method of polishing a substrate, the method of polishing including: providing a polishing pad according to any one of the previous polishing pads; providing a substrate, contacting the working surface of the polishing pad with the substrate surface, moving the polishing pad and the substrate relative to one another while maintaining contact between the working surface of the polishing pad and the substrate
(Continued)

surface, wherein polishing is conducted in the presence of a polishing solution.

16 Claims, 12 Drawing Sheets

(51) Int. Cl.
  *B24B 37/26* (2012.01)
  *B24D 3/28* (2006.01)
  *B24D 11/02* (2006.01)
  B24D 18/00 (2006.01)
  H01L 21/304 (2006.01)

(52) U.S. Cl.
  CPC ............... *B24D 3/28* (2013.01); *B24D 11/02* (2013.01); *B24D 18/0009* (2013.01); *H01L 21/304* (2013.01)

(58) Field of Classification Search
  CPC ........ B24D 11/00; B24D 11/02; B24D 3/002; B24D 3/02; B24D 3/20; B24D 3/28; B24D 13/14
  USPC .......... 451/41, 526, 527, 530, 532, 533, 539
  See application file for complete search history.

(56) References Cited

U.S. PATENT DOCUMENTS

| | | | |
|---|---|---|---|
| 5,489,233 A | 2/1996 | Cook | |
| 5,958,794 A | 9/1999 | Bruxvoort | |
| 6,132,292 A | 10/2000 | Kubo | |
| 6,234,875 B1 | 5/2001 | Pendergrass, Jr. | |
| 6,285,001 B1 | 9/2001 | Fleming | |
| 6,372,323 B1 | 4/2002 | Kobe | |
| 6,406,363 B1* | 6/2002 | Xu | B24B 37/205 451/296 |
| 6,736,714 B2* | 5/2004 | Dudovicz | B24D 11/06 451/536 |
| 6,852,766 B1 | 2/2005 | DeVoe | |
| 7,091,255 B2 | 8/2006 | DeVoe | |
| 7,201,647 B2 | 4/2007 | Lombardo | |
| 7,226,345 B1* | 6/2007 | Dornfeld | B24B 37/26 451/285 |
| 8,634,146 B2 | 1/2014 | David | |
| 10,252,396 B2* | 4/2019 | Lehuu | B24B 7/241 |
| 2001/0034197 A1* | 10/2001 | Dudovicz | B24B 37/26 451/168 |
| 2002/0028646 A1* | 3/2002 | Jensen | B24D 11/001 451/527 |
| 2002/0031984 A1* | 3/2002 | Moore | B24B 37/26 451/36 |
| 2003/0150169 A1 | 8/2003 | Annen | |
| 2003/0228836 A1* | 12/2003 | Lombardo | B24B 37/22 451/533 |
| 2004/0142638 A1* | 7/2004 | Petroski | B24B 37/24 451/41 |
| 2009/0215363 A1* | 8/2009 | Sung | B24B 37/24 451/56 |
| 2010/0188751 A1 | 7/2010 | Clarke | |
| 2014/0256231 A1 | 9/2014 | Repper et al. | |
| 2015/0056895 A1* | 2/2015 | Fotou | B24B 37/24 451/59 |
| 2015/0065020 A1* | 3/2015 | Roy | B24B 11/04 451/529 |
| 2017/0173758 A1* | 6/2017 | Lehuu | B24B 37/22 |
| 2020/0246937 A1* | 8/2020 | Bresson | B24B 37/26 |

FOREIGN PATENT DOCUMENTS

| | | |
|---|---|---|
| WO | WO 2015-153597 | 10/2015 |
| WO | WO 2015-153601 | 10/2015 |

\* cited by examiner

POLISHING PADS AND SYSTEMS AND METHODS OF MAKING AND USING THE SAME

CROSS REFERENCE TO RELATED APPLICATIONS

This application is a national stage filing under 35 U.S.C. 371 of PCT/US2016/055908, filed Oct. 7, 2016, which claims the benefit of U.S. Provisional Application No. 62/266,963, filed Dec. 14, 2015 and U.S. Provisional Application No. 62/238,668, filed Oct. 7, 2015, the disclosure of which is incorporated by reference in their entirety herein.

FIELD

The present disclosure relates to polishing pads and systems useful for the polishing of substrates, and methods of making and using such polishing pads.

BACKGROUND

Polishing pads useful for polishing the surfaces of substrates, e.g. semiconductor wafer surfaces are known in the art, for example, PCT Publ. Appl. Nos. WO 2015/153597 A1 and WO 2015/153601 A1, U.S. Pat. Nos. 5,489,233; 5,958,794 and 6,234,875.

SUMMARY

In one embodiment, the present disclosure provides a polishing pad comprising:
i) a polishing layer having a working surface and a second surface opposite the working surface; wherein the working surface includes a land region and at least one of a plurality of precisely shaped pores and a plurality of precisely shaped asperities, the thickness of the land region is less than about 5 mm and the polishing layer comprises a polymer; ii) a porous substrate having a first major surface, an opposed second major surface and a plurality of voids and; iii) an interfacial region wherein a portion of the polymer of the polishing layer is embedded in the at least a portion of the plurality of voids of the porous substrate.

In another embodiment, the present disclosure provides a polishing pad including the previous polishing pad, wherein the porous substrate is at least one of a film substrate having at least one of a plurality of holes and a plurality of through holes, a woven or nonwoven substrate and an open cell foam. In some embodiments, the porous substrate does not include an open cell foam.

In another embodiment, the present disclosure provides a polishing pad including any one of the previous polishing pads, wherein the polishing layer further includes at least one macro-channel.

In another embodiment, the present disclosure provides a polishing pad including the previous polishing pads, wherein the interfacial region aligns, through the thickness of the polishing pad, with the at least one macro-channel.

In another embodiment, the present disclosure provides a polishing pad including any one of the previous polishing pads, wherein the polishing layer further includes a plurality of independent and/or inter-connected macro-channels.

In another embodiment, the present disclosure provides a polishing pad including the previous polishing pad, wherein the interfacial region aligns, through the thickness of the polishing pad, with the plurality of independent and/or inter-connected macro-channels.

In another embodiment, the present disclosure provides a polishing pad including any one of the previous polishing pads, wherein the polymer of the polishing layer is a thermoplastic.

In another embodiment, the present disclosure provides a polishing pad including any one of the previous polishing pads, wherein the polishing layer includes a plurality of nanometer-size topographical features on at least one of the surface of the precisely shaped asperities, the surface of the precisely shaped pores and the surface of the land region.

In another embodiment, the present disclosure provides a polishing pad including any one of the previous polishing pads, wherein the working surface comprises a secondary surface layer and a bulk layer; and wherein at least one of the receding contact angle and advancing contact angle of the secondary surface layer is at least about 20° less than the corresponding receding contact angle or advancing contact angle of the bulk layer.

In another embodiment, the present disclosure provides a polishing pad including any one of the previous polishing pads, wherein the working surface comprises a secondary surface layer and a bulk layer; and wherein the receding contact angle of the working surface is less than about 50°.

In yet another embodiment, the present disclosure provides polishing system comprising any one of the previous polishing pads and a polishing solution.

In another embodiment, the present disclosure provides a method of polishing a substrate, the method comprising:
providing a polishing pad according to any one of the previous polishing pads;
providing a substrate;
contacting the working surface of the polishing pad with the substrate surface;
moving the polishing pad and the substrate relative to one another while maintaining contact between the working surface of the polishing pad and the substrate surface; and
wherein polishing is conducted in the presence of a polishing solution.

In yet another embodiment, the present disclosure provides a method of making a polishing pad comprising:
providing a polymer;
providing a porous substrate having a plurality of voids, the porous substrate being adjacent to the polymer;
embossing a surface of the polymer to form a polishing layer having a working surface, wherein the working surface includes a land region and at least one of a plurality of precisely shaped pores and a plurality of precisely shaped asperities; wherein the embossing forms an interfacial region having a portion of the polymer of the polishing layer embedded in the at least a portion of the plurality of voids of the porous substrate.

In another embodiment, the present disclosure provides a method of making a polishing pad according to the previous method, wherein the polymer is a polymer film.

The above summary of the present disclosure is not intended to describe each embodiment of the present disclosure. The details of one or more embodiments of the disclosure are also set forth in the description below. Other features, objects, and advantages of the disclosure will be apparent from the description and from the claims.

BRIEF DESCRIPTION OF THE DRAWINGS

The disclosure may be more completely understood in consideration of the following detailed description of various embodiments of the disclosure in connection with the accompanying figures, in which.

Figure 1A:
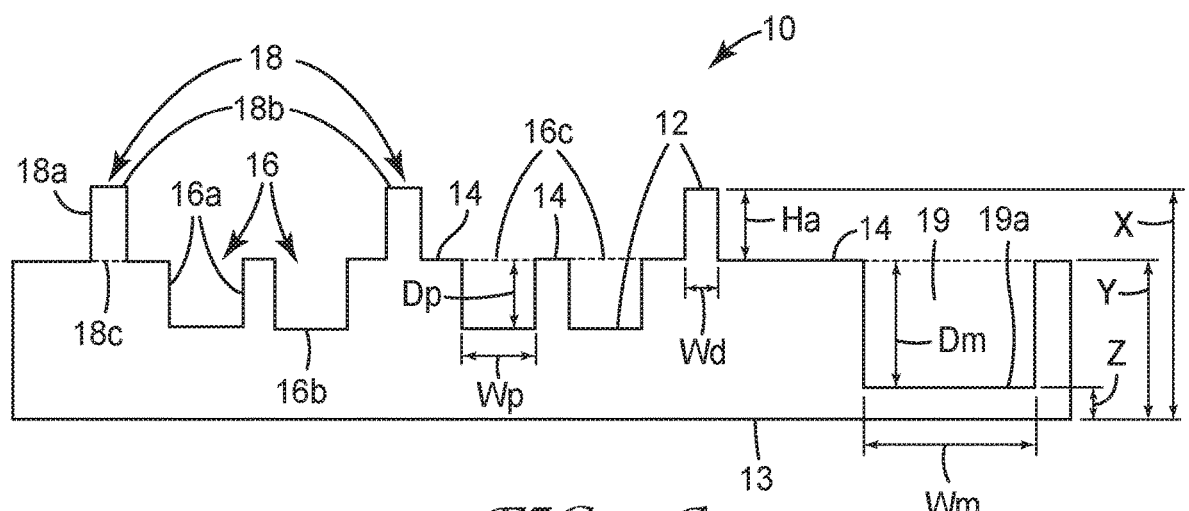
FIG. 1A is a schematic cross-sectional diagram of a portion of a polishing layer in accordance with some embodiments of the present disclosure.

Throughout this disclosure, unless indicated otherwise, the word "fiber" is meant to include both the singular and plural forms.

DETAILED DESCRIPTION

Various articles, systems and methods have been employed for the polishing of substrates. The polishing articles, systems and methods are selected based on the desired end use characteristics of the substrates, including but not limited to, surface finish, e.g. surface roughness and defects (scratches, pitting and the like), and planarity, including both local planarity, i.e. planarity in a specific region of the substrate, and global planarity, i.e. planarity across the entire substrate surface. The polishing of substrates such as semiconductor wafers presents particularly difficult challenges, as end-use requirements may be extremely stringent due to the micron-scale and even nanometer-scale features that need to be polished to a required specification, e.g. surface finish. Often, along with improving or maintaining a desired surface finish, the polishing process also requires material removal, which may include material removal within a single substrate material or simultaneous material removal of a combination of two or more different materials, within the same plane or layer of the substrate. Materials that may be polished alone or simultaneously include both electrically insulating materials, i.e. dielectrics, and electrically conductive materials, e.g. metals. For example, during a single polishing step involving barrier layer chemical mechanical planarization (CMP), the polishing pad may be required to remove metal, e.g. copper, and/or adhesion/barrier layers and/or cap layers, e.g. tantalum and tantalum nitride, and/or dielectric material, e.g. an inorganic material, such as, silicone oxide or other glasses. Due to the differences in the material properties and polishing characteristics between the dielectric layers, metal layers, adhesion/barrier and/or cap layers, combined with the wafer feature sizes to be polished, the demands on the polishing pad can be extreme. In order to meet the rigorous requirements, the polishing pad and its corresponding mechanical properties need to be extremely consistent from pad to pad, else the polishing characteristics will change from pad to pad, which can adversely affect corresponding wafer processing times and final wafer parameters.

Currently, many CMP processes employ polishing pads with included pad topography, pad surface topography being particularly important. One type of topography relates to pad porosity, e.g. pores within the pad. The porosity is desired, as the polishing pad is usually used in conjunction with a polishing solution, typically a slurry (a fluid containing abrasive particles), and the porosity enables a portion of the polishing solution deposited on the pad to be contained in the pores. Generally, this is thought to facilitate the CMP process. Typically, polishing pads are organic materials that are polymeric in nature. One current approach to include pores in a polishing pad is to produce a polymeric foam polishing pad, where the pores are introduced as a result of the pad fabrication (foaming) process. Another approach is to prepare a pad composed of two or more different polymers, a polymer blend, that phase separates, forming a two phase structure. At least one of the polymers of the blend is water or solvent soluble and is extracted either prior to polishing or during the polishing process to create pores at least at or near the pad working surface. The working surface of the pad is the pad surface adjacent to and in at least partial contact with the substrate to be polished, e.g. a wafer surface. Introduction of pores in the polishing pad not only facilitates polishing solution usage, it also alters the mechanical properties of the pad, as porosity often leads to a softer or lower stiffness pad. The mechanical properties of the pad also play a key role in obtaining the desired polishing results. However, introduction of the pores via a foaming or polymer blend/extraction process, creates challenges in obtaining uniform pore size, uniform pore distribution and uniform total pore volumes within a single pad and from pad to pad. Additionally, as some of the process steps that are used to fabricate the pad are somewhat random in nature (foaming a polymer and mixing polymers to form a polymer blend), random variations in pore size, distribution and total pore volume can occur. This creates variation within a single pad and variations between different pads that may cause unacceptable variations in polishing performance.

A second type of pad topography critical to the polishing process relates to asperities on the pad surface. The current polymeric pads used in CMP, for example, often require a pad conditioning process to produce the desired pad surface topography. This surface topography includes asperities that will come into physical contact with the substrate surface being polished. The size and the distribution of the asperities are thought to be a key parameter with respect to the pad polishing performance. The pad conditioning process generally employs a pad conditioner, an abrasive article having abrasive particles, which is brought into contact with the pad surface at a designated pressure, while moving the pad surface and conditioner surface relative to each other. The abrasive particles of the pad conditioner abrade the surface of the polishing pad and create the desired surface texture, e.g. asperities. The use of a pad conditioner process brings additional variability into the polishing process, as obtaining the desired size, shape and areal density of asperities across the entire pad surface becomes dependent on both the process parameters of the conditioning process and how well they can be maintained, the uniformity of the abrasive surface of the pad conditioner and the uniformity of the pad mechanical properties across the pad surface and through the depth of the pad. This additional variability due to the pad conditioning process may also cause unacceptable variations in polishing performance.

Another parameter related to the polishing pad asperities is the uniformity of the height of the distal ends of the asperities, i.e. having the distal ends of the asperities lie along a plane as opposed to having a significant variation in height relative to this plane. A uniform height of the distal ends of the asperities may increase pad life as well as improve polishing performance. In some manufacturing processes, the polishing layer of the polishing pad (the polishing layer including the asperities) is fabricated by an embossing process, where an embossing roll embosses the asperities into the surface of a first polymer, e.g. a polymer film, to form the polishing layer. In the fabrication of the polishing layer, it may be desirable to have a support substrate, e.g. a polymer film, adjacent the polishing layer. In these constructions, the support substrate may restrict the flow of first polymer that is being displaced by the features of the embossing roll during the embossing process. This phenomena is exacerbated by an increase in the height and/or depth of the features being embossed into the polishing layer. With respect to the thickness of the polishing layer, the restriction of flow of the first polymer may lead to a non-uniform thickness of the polishing layer, which cause the distal ends of the asperities to have a non-uniform height. The non-uniformity of the asperity height can cause non-uniform polishing behavior of the polishing pad and may decrease polishing pad life and may decrease polishing performance. Thus, there is a desire to minimize or eliminate the non-uniformity in height of the distal ends of the polishing layer.

Overall, there is a continuing need for improved polishing pads that can provide consistent, reproducible pad surface topography, e.g. asperities and/or porosity and/or uniform asperity height, both within a single pad and from pad to pad, to enable enhanced and/or more reproducible polishing performance.

Definitions

As used herein, the singular forms "a", "an", and "the" include plural referents unless the content clearly dictates otherwise. As used in this specification and the appended embodiments, the term "or" is generally employed in its sense including "and/or" unless the content clearly dictates otherwise.

As used herein, the recitation of numerical ranges by endpoints includes all numbers subsumed within that range (e.g. 1 to 5 includes 1, 1.5, 2, 2.75, 3, 3.8, 4, and 5).

Unless otherwise indicated, all numbers expressing quantities or ingredients, measurement of properties and so forth used in the specification and embodiments are to be understood as being modified in all instances by the term "about." Accordingly, unless indicated to the contrary, the numerical parameters set forth in the foregoing specification and attached listing of embodiments can vary depending upon the desired properties sought to be obtained by those skilled in the art utilizing the teachings of the present disclosure. At the very least, and not as an attempt to limit the application of the doctrine of equivalents to the scope of the claimed embodiments, each numerical parameter should at least be construed in light of the number of reported significant digits and by applying ordinary rounding techniques.

"Working surface" refers to the surface of a polishing pad that will be adjacent to and in at least partial contact with the surface of the substrate being polished.

"Pore", with respect to the working surface of a polishing layer, refers to a cavity in the working surface of a pad that allows a fluid, e.g. a liquid, to be contained therein. The pore enables at least some fluid to be contained within the pore and not flow out of the pore.

"Precisely shaped" refers to a topographical feature, e.g. an asperity or pore, having a molded shape that is the inverse shape of a corresponding mold cavity or mold protrusion, said shape being retained after the topographical feature is removed from the mold. A pore formed through a foaming process or removal of a soluble material (e.g. a water soluble particle) from a polymer matrix, is not a precisely shaped pore.

"Micro-replication" refers to a fabrication technique wherein precisely shaped topographical features are prepared by casting or molding a polymer (or polymer precursor that is later cured to form a polymer) in a production tool, e.g. a mold or embossing tool, wherein the production tool has a plurality of micron sized to millimeter sized topographical features. Upon removing the polymer from the production tool, a series of topographical features are present in the surface of the polymer. The topographical features of the polymer surface have the inverse shape as the features of the original production tool. The micro-replication fabrication techniques disclosed herein inherently result in the formation of a micro-replicated layer, i.e. a polishing layer, which includes micro-replicated asperities, i.e. precisely shaped asperities, when the production tool has cavities, and micro-replicated pores, i.e. precisely shaped pores, when the production tool has protrusions. If the production tool includes cavities and protrusions, the micro-replicated layer (polishing layer) will have both micro-replicated asperities, i.e. precisely shaped asperities, and micro-replicated pores, i.e. precisely shaped pores.

The present disclosure is directed to articles, systems, and methods useful for polishing substrates, including but not limited to, semiconductor wafers. The demanding tolerances associated with semiconductor wafer polishing require the use of consistent polishing pad materials and consistent polishing processes, including pad conditioning, to form the desired topography, e.g. asperities, in the pad surface. Current polishing pads, due to their fabrication processes, have inherent variability in key parameters, such as pore size, distribution and total volume across the pad surface and through the pad thickness. Additionally, there is variability in the asperity size and distribution across the pad surface, due to variability in the conditioning process and variability in the material properties of the pad and there may also be variability in the height of the distal ends of the asperities, relative to one another. The polishing pads of the present disclosure overcome many of these issues by providing a working surface of the polishing pad that is precisely designed and engineered to have a plurality of reproducible topographical features, including at least one of asperities, pores and combinations thereof. The asperities and pores are designed to have dimensions ranging from millimeters down to microns, with tolerances being as low as 1 micron or less. Due to the precisely engineered asperity topography and uniformity in the heights of the distal ends of the asperities, the polishing pads of the present disclosure may be used without conditioning process, eliminating the need for an abrasive pad conditioner and the corresponding conditioning process, resulting in considerable cost savings. Additionally, the precisely engineered pore topography insures uniform pores size and distribution across the polishing pad working surface, which leads to improved polishing performance and lower polishing solution usage.

Useful polishing layers, as well as, polishing materials and processes for fabricating the polishing layers of the present disclosure are included in PCT Publ. Appl. No. WO 2015/153597 A1, titled "POLISHING PADS AND SYSTEMS AND METHODS OF MAKING AND USING THE SAME", which is incorporated herein by reference in its entirety.

A schematic cross-sectional diagram of a portion of a polishing layer 10 according to some embodiments of the present disclosure is shown in FIG. 1A. Polishing layer 10, having thickness X, includes working surface 12 and second surface 13 opposite working surface 12. Working surface 12 is a precisely engineered surface having precisely engineered topography. The working surface includes at least one of a plurality of precisely shaped pores, precisely shaped asperities and combinations thereof. Working surface 12 includes a plurality of precisely shaped pores 16 having a depth Dp, sidewalls 16a and bases 16b and a plurality of precisely shaped asperities 18 having a height Ha, sidewalls 18a and distal ends 18b, the distal ends having width Wd. The width of the precisely shaped asperities and asperity bases may be the same as the width of their distal ends, Wd. Land region 14 is located in areas between precisely shaped pores 16 and precisely shaped asperities 18 and may be considered part of the working surface. The intersection of a precisely shaped asperity sidewall 18a with the surface of land region 14 adjacent thereto defines the location of the bottom of the asperity and defines a set of precisely shaped asperity bases 18c. The intersection of a precisely shaped pore sidewall 16a with the surface of land region 14 adjacent thereto is considered to be the top of the pore and defines a set of precisely shaped pore openings 16c, having a width Wp. As the bases of the precisely shaped asperities and the openings of adjacent precisely shaped pores are determined by the adjacent land region, the asperity bases are substantially coplanar relative to at least one adjacent pore opening. In some embodiment, a plurality of the asperity bases are substantially coplanar relative to at least one adjacent pore opening. A plurality of asperity bases may include at least about 10%, at least about 30%, at least about 50%, at least about 70%, at least about 80%, at least about 90%, at least about 95%, at least about 97%, at least about 99% or even at least about 100% of the total asperity bases of the polishing layer. The land region provides a distinct area of separation between the precisely shaped features, including separation between adjacent precisely shaped asperities and precisely shaped pores, separation between adjacent precisely shaped pores, and/or separation between adjacent precisely shaped asperities.

Land region 14 may be substantially planar and have a substantially uniform thickness, Y, although minor curvature and/or thickness variations consistent with the manufacturing process may be present. As the thickness of the land region, Y, must be greater than the depth of the plurality of precisely shaped pores, the land region may be of greater thickness than other abrasive articles known in the art that may have only asperities. In some embodiments of the present disclosure, when both precisely shaped asperities and precisely shaped pores are both present in the polishing layer, the inclusion of a land region allows one to design the areal density of the plurality of precisely shaped asperities independent of the areal density of the plurality precisely shaped pores, providing greater design flexibility. This is in contrast to conventional pads which may include forming a series of intersecting grooves in a, generally, planar pad surface. The intersecting grooves lead to the formation of a textured working surface, with the grooves (regions where material was removed from the surface) defining the upper regions of the working surface (regions where material was not removed from the surface), i.e. regions that would contact the substrate being abraded or polished. In this known approach, the size, placement and number of grooves define the size, placement and number of upper regions of the working surface, i.e. the areal density of the upper regions of working surface are dependent on the areal density of the grooves. The grooves also may run the length of the pad allowing the polishing solution to flow out of the groove, in contrast to a pore that can contain the polishing solution. Particularly, the inclusion of precisely shaped pores, which can hold and retain the polishing solution proximate to the working surface, may provide enhanced polishing solution delivery for demanding applications, e.g. CMP.

Polishing layer 10 may include at least one macro-channel. FIG. 1A shows macro-channel 19 having width Wm, a depth Dm and base 19a. A secondary land region having a thickness, Z, is defined by macro-channel base 19a. The secondary land region defined by the base of the macro-channel would not be considered part of land region 14, previously described. In some embodiments, one or more secondary pores (not shown) may be included in at least a portion of the base of the at least one macro-channel. The one or more secondary pores have secondary pore openings (not shown), the secondary pore openings being substantially coplanar with base 19a of the macro-channel 19. In some embodiments, the base of the at least one macro-channel is substantially free of secondary pores.

The shape of precisely shaped pores 16 is not particularly limited and includes, but is not limited to, cylinders, half spheres, cubes, rectangular prism, triangular prism, hexagonal prism, triangular pyramid, 4, 5 and 6-sided pyramids, truncated pyramids, cones, truncated cones and the like. The lowest point of a precisely shaped pore 16, relative to the pore opening, is considered to be the bottom of the pore. The shape of all the precisely shaped pores 16 may all be the same or combinations may be used. In some embodiments, at least about 10%, at least about 30%, at least about 50%, at least about 70%, at least about 90%, at least about 95%, at least about 97%, at least about 99% or even at least about 100% of the precisely shaped pores are designed to have the same shape and dimensions. Due to the precision fabrication processes used to fabricate the precisely shaped pores, the tolerances are, generally, small. For a plurality of precisely shaped pores designed to have the same pore dimensions, the pore dimensions are uniform. In some embodiments, the standard deviation of at least one distance dimension corresponding to the size of the plurality of precisely shaped pores; e.g. height, width of a pore opening, length, and diameter; is less than about 20%, less than about 15%, less than about 10%, less than about 8%, less than about 6% less than about 4%, less than about 3%, less than about 2%, or even less than about 1%. The standard deviation can be measured by known statistical techniques. The standard deviation may be calculated from a sample size of at least 5 pores, or even at least 10 pores at least 20 pores. The sample size may be no greater than 200 pores, no greater than 100 pores or even no greater than 50 pores. The sample may be selected randomly from a single region on the polishing layer or from multiple regions of the polishing layer.

The longest dimension of the precisely shaped pore openings 16c, e.g. the diameter when the precisely shaped pores 16 are cylindrical in shape, may be less than about 10 mm, less than about 5 mm, less than about 1 mm, less than about 500 microns, less than about 200 microns, less than about 100 microns, less than about 90 microns, less than about 80 microns, less than about 70 microns or even less than about 60 microns. The longest dimension of the precisely shaped pore openings 16c may be greater than about 1 micron, greater than about 5 microns, greater than about 10 microns, greater than about 15 microns or even greater than about 20 microns. The cross-sectional area of the precisely shaped pores 16, e.g. a circle when the precisely shaped pores 16 are cylindrical in shape, may be uniform throughout the depth of the pore, or may decrease, if the precisely shaped pore sidewalls 16a taper inward from opening to base, or may increase, if the precisely shaped pore sidewalls 16a taper outward. The precisely shaped pore openings 16c may all have about the same longest dimensions or the longest dimension may vary between precisely shaped pore openings 16c or between sets of different precisely shaped pore openings 16c, per design. The width, Wp, of the precisely shaped pore openings may be equal to the values give for the longest dimension, described above.

The depth of the plurality of precisely shaped pores, Dp, is not particularly limited. In some embodiments, the depth of the plurality of precisely shaped pores is less than the thickness of the land region adjacent to each precisely shaped pore, i.e. the precisely shaped pores are not through-holes that go through the entire thickness of land region 14. This enables the pores to trap and retain fluid proximate the working surface. Although the depth of the plurality of precisely shaped pores may be limited as indicated above, this does not prevent the inclusion of one or more other through-holes in the pad, e.g. through-holes to provide polishing solution up through the polishing layer to the working surface or a path for airflow through the pad. A through-hole is defined as a hole going through the entire thickness, Y, of the land region 14. In some embodiments, the polishing layer is free of through-holes.

The depth, Dp, of the plurality of precisely shaped pores 16 may be less than about 5 mm, less than about 1 mm, less than about 500 microns, less than about 200 microns, less than about 100 microns, less than about 90 microns, less than about 80 microns, less than about 70 microns or even less than about 60 microns. The depth of the precisely shaped pores 16 may be greater than about 1 micron, greater than about 5 microns, greater than about 10 microns, greater than about 15 microns or even greater than about 20 microns. The depth of the plurality precisely shaped pores may be between about 1 micron and about 5 mm, between about 1 micron and about 1 mm, between about 1 micron and about 500 microns, between about 1 microns and about 200 microns, between about 1 microns and about 100 microns, 5 micron and about 5 mm, between about 5 micron and about 1 mm, between about 5 micron and about 500 microns, between about 5 microns and about 200 microns or even between about 5 microns and about 100 microns The precisely shaped pores 16 may all have the same depth or the depth may vary between precisely shaped pores 16 or between sets of different precisely shaped pores 16.

In some embodiment, the depth of at least about 10%, at least about 30% at least about 50%, at least 70%, at least about 80%, at least about 90%, at least about 95% or even at least about 100% of the plurality precisely shaped pores is between about 1 micron and about 500 microns, between about 1 micron and about 200 microns, between about 1 micron and about 150 microns, between about 1 micron and about 100 micron, between about 1 micron and about 80 microns, between about 1 micron and about 60 microns, between about 5 microns and about 500 microns, between about 5 micron and about 200 microns, between about 5 microns and 150 microns, between about 5 micron and about 100 micron, between about 5 micron and about 80 microns, between about 5 micron and about 60 microns, between about 10 microns and about 200 microns, between about 10 microns and about 150 microns or even between about 10 microns and about 100 microns.

In some embodiments, the depth of at least a portion of, up to and including all, the plurality of precisely shaped pores is less than the depth of at least a portion of the at least one macro-channel. In some embodiments, the depth of at least about 50%, at least about 60%, at least about 70%, at least about 80%, at least about 90%, at least about 95%, at least about 99% or even at least about 100% of the plurality of precisely pores is less than the depth of at least a portion of a macro-channel.

The precisely shaped pores 16 may be uniformly distributed, i.e. have a single areal density, across the surface of polishing layer 10 or may have different areal density across the surface of polishing layer 10. The areal density of the precisely shaped pores 16 may be less than about 1,000,000/mm$^2$, less than about 500,000/mm$^2$, less than about 100,000/mm$^2$, less than about 50,000/mm$^2$, less than about 10,000/mm$^2$, less than about 5,000/mm$^2$, less than about 1,000/mm$^2$, less than about 500/mm$^2$, less than about 100/mm$^2$, less than about 50/mm$^2$, less than about 10/mm$^2$, or even less than about 5/mm$^2$. The areal density of the precisely shaped pores 16 may be greater than about 1/dm$^2$, may be greater than about 10/dm$^2$, greater than about 100/dm$^2$, greater than about 5/cm$^2$, greater than about 10/cm$^2$, greater than about 100/cm$^2$, or even greater than about 500/cm$^2$.

The ratio of the total cross-sectional area of the precisely shaped pore openings 16c, to the projected polishing pad surface area may be greater than about 0.5%, greater than about 1%, greater than about 3% greater than about 5%, greater than about 10%, greater than about 20%, greater than about 30%, greater than about 40% or even greater than about 50%. The ratio of the total cross-sectional area of the precisely shaped pore openings 16c, with respect to the projected polishing pad surface area may be less than about 90%, less than about 80%, less than about 70%, less than about 60%, less than about 50% less than about 40%, less than about 30%, less than about 25% or even less than about 20%. The projected polishing pad surface area is the area resulting from projecting the shape of the polishing pad onto a plane. For example, a circular shaped polishing pad having a radius, r, would have a projected surface area of pi times the radius squared, i.e. the area of the projected circle on a plane.

The precisely shaped pores 16 may be arranged randomly across the surface of polishing layer 10 or may be arranged in a pattern, e.g. a repeating pattern, across polishing layer 10. Patterns include, but are not limited to, square arrays, hexagonal arrays and the like. Combination of patterns may be used.

The shape of precisely shaped asperities 18 is not particularly limited and includes, but is not limited to, cylinders, half spheres, cubes, rectangular prism, triangular prism, hexagonal prism, triangular pyramid, 4, 5 and 6-sided pyramids, truncated pyramids, cones, truncated cones and the like. The intersection of a precisely shaped asperity sidewall 18a with the land region 14 is considered to be the base of the asperity. The highest point of a precisely shaped asperity 18, as measured from the asperity base 18c to a distal end 18b, is considered to be the top of the asperity and the distance between the distal end 18b and asperity base 18c is the height of the asperity. The shape of all the precisely shaped asperities 18 may all be the same or combinations may be used. In some embodiments, at least about 10%, at least about 30%, at least about 50%, at least about 70%, at least about 90%, at least about 95%, at least about 97%, at least about 99% or even at least about 100% of the precisely shaped asperities are designed to have the same shape and dimensions. Due to the precision fabrication processes used to fabricate the precisely shaped asperities, the tolerances are, generally, small. For a plurality of precisely shaped asperities designed to have the same asperity dimensions, the asperity dimensions are uniform. In some embodiments, the stand deviation of at least one distance dimension corresponding to the size of a plurality of precisely shaped asperities, e.g. height, width of a distal end, width at the base, length, and diameter, is less than about 20%, less than about 15%, less than about 10%, less than about 8%, less than about 6% less than about 4%, less than about 3%, less than about 2%, or even less than about 1%. The standard deviation can be measured by known statistical techniques. The standard deviation may be calculated from a sample size of at least 5 asperities at least 10 asperities or even at least 20 asperities or even more. The sample size may be no greater than 200 asperities, no greater than 100 asperities or even no greater than 50 asperities. The sample may be selected randomly from a single region on the polishing layer or from multiple regions of the polishing layer.

In some embodiments, at least about 50%, at least about 70%, at least about 90%, at least about 95%, at least about 97%, at least about 99% and even at least about 100% of the precisely shaped asperities are solid structures. A solid structure is defined as a structure that contains less than about 10%, less than about 5%, less than about 3%, less than about 2%, less than about 1%, less than about 0.5% or even 0% porosity by volume. Porosity may include open cell or closed cell structures, as would be found for example in a foam, or machined holes purposely fabricated in the asperities by known techniques, such as, punching, drilling, die cutting, laser cutting, water jet cutting and the like. In some embodiments, the precisely shaped asperities are free of machined holes. As a result of the machining process, machined holes may have unwanted material deformation or build-up near the edge of the hole that can cause defects in the surface of the substrates being polished, e.g. semiconductor wafers.

The longest dimension, with respect to the cross-sectional area of the precisely shaped asperities 18, e.g. the diameter when the precisely shaped asperities 18 are cylindrical in shape, may be less than about 10 mm, less than about 5 mm, less than about 1 mm, less than about 500 microns, less than about 200 microns, less than about 100 microns, less than about 90 microns, less than about 80 microns, less than about 70 microns or even less than about 60 microns. The longest dimension of the of the precisely shaped asperities 18 may be greater than about 1 micron, greater than about 5 microns, greater than about 10 microns, greater than about 15 microns or even greater than about 20 microns. The cross-sectional area of the precisely shaped asperities 18, e.g. a circle when the precisely shaped asperities 18 are cylindrical in shape, may be uniform throughout the height of the asperities, or may decrease, if the precisely shaped asperities' sidewalls 18a taper inward from the top of the asperity to the base, or may increase, if the precisely shaped asperities' sidewalls 18a taper outward from the top of the asperity to the bases. The precisely shaped asperities 18 may all have the same longest dimensions or the longest dimension may vary between precisely shaped asperities 18 or between sets of different precisely shaped asperities 18, per design. The width, Wd, of the distal ends of the precisely shaped asperity bases may be equal to the values give for the longest dimension, described above. The width of the precisely shaped asperity bases may be equal to the values give for the longest dimension, described above.

The height of the precisely shaped asperities 18 may be may be less than about 5 mm, less than about 1 mm, less than about 500 microns, less than about 200 microns, less than about 100 microns, less than about 90 microns, less than about 80 microns, less than about 70 microns or even less than about 60 microns. The height of the precisely shaped asperities 18 may be greater than about 1 micron, greater than about 5 microns, greater than about 10 microns, greater than about 15 microns or even greater than about 20 microns. The precisely shaped asperities 18 may all have the same height or the height may vary between precisely shaped asperities 18 or between sets of different precisely shaped asperities 18. In some embodiments, the polishing layer's working surface includes a first set of precisely shaped asperities and at least one second set of precisely shaped asperities wherein the height of the first set of precisely shaped asperities is greater than the height of the seconds set of precisely shaped asperities. Having multiple sets of a plurality of precisely shaped asperities, each set having different heights, may provide different planes of polishing asperities. This may become particularly beneficial, if the asperity surfaces have been modified to be hydrophilic, and, after some degree of polishing the, first set of asperities are worn down (including removal of the hydrophilic surface), allowing the second set of asperities to make contact with the substrate being polished and provide fresh asperities for polishing. The second set of asperities may also have a hydrophilic surface and enhance polishing performance over the worn first set of asperities. The first set of the plurality of precisely shaped asperities may have a height between 3 microns and 50 microns, between 3 microns and 30 microns, between 3 microns and 20 microns, between 5 microns and 50 microns, between 5 microns and 30 microns, between 5 microns and 20 microns, between 10 microns and 50 microns, between 10 microns and 30 microns, or even between 10 microns and 20 microns greater than the height of the at least one second set of the plurality of precisely shaped asperities.

In some embodiment, in order to facilitate the utility of the polishing solution at the polishing layer-polishing substrate interface, the height of at least about 10%, at least about 30% at least about 50%, at least 70%, at least about 80%, at least about 90%, at least about 95% or even at least about 100% of the plurality precisely shaped asperities is between about 1 micron and about 500 microns, between about 1 micron and about 200 microns, between about 1 micron and about 100 micron, between about 1 micron and about 80 microns, between about 1 micron and about 60 microns, between about 5 microns and about 500 microns, between about 5 micron and about 200 microns, between about 5 microns and about 150 microns, between about 5 micron and about 100 micron, between about 5 micron and about 80 microns, between about 5 micron and about 60 microns, between about 10 microns and about 200 microns, between about 10 microns and about 150 microns or even between about 10 microns and about 100 microns.

The precisely shaped asperities 18 may be uniformly distributed, i.e. have a single areal density, across the surface of the polishing layer 10 or may have different areal density across the surface of the polishing layer 10. The areal density of the precisely shaped asperities 18 may be less than about 1,000,000/mm$^2$, less than about 500,000/mm$^2$, less than about 100,000/mm$^2$, less than about 50,000/mm$^2$, less than about 10,000/mm$^2$, less than about 5,000/mm$^2$, less than about 1,000/mm$^2$, less than about 500/mm$^2$, less than about 100/mm$^2$, less than about 50/mm$^2$, less than about 10/mm$^2$, or even less than about 5/mm$^2$. The areal density of the precisely shaped asperities 18 may be greater than about 1/dm$^2$, may be greater than about 10/dm$^2$, greater than about 100/dm$^2$, greater than about 5/cm$^2$, greater than about 10/cm$^2$, greater than about 100/cm$^2$, or even greater than about 500/cm$^2$. In some embodiments, the areal density of the plurality of precisely shaped asperities is independent of the areal density of the plurality precisely shaped pores.

The precisely shaped asperities 18 may be arranged randomly across the surface of polishing layer 10 or may be arranged in a pattern, e.g. a repeating pattern, across polishing layer 10. Patterns include, but are not limited to, square arrays, hexagonal arrays and the like. Combination of patterns may be used.

The total cross-sectional area of distal ends 18b with respect to the total projected polishing pad surface area may be greater than about 0.01%, greater than about 0.05%, greater than about 0.1%, greater than about 0.5%, greater than about 1%, greater than about 3% greater than about 5%, greater than about 10%, greater than about 15%, greater than about 20% or even greater than about 30%. The total cross-sectional area of distal ends 18b of precisely shaped asperities 18 with respect to the total projected polishing pad surface area may be less than about 90%, less than about 80%, less than about 70%, less than about 60%, less than about 50% less than about 40%, less than about 30%, less than about 25% or even less than about 20%. The total cross-sectional area of the precisely shaped asperity bases with respect to the total projected polishing pad surface area may be the same as described for the distal ends.

The planarity variance in the height, i.e. the height of the difference between the maximum and minimum heights of precisely shaped asperities in a given sample (e.g. a set of precisely shaped asperities within a cell), of asperities may be less than 30 microns, less than 25 microns. less than 20 microns, less than 15 microns, less than 12 microns, less than 10 microns, less than 7 microns or even less than 5 microns. The planarity variance in the height of a given sample of asperities may be greater than 0, greater than 1 microns, greater than 2 microns or even greater than 3 microns. The sample size may be at least 20 asperities, at least 30 asperities, at least 40 asperities or even at least 50 asperities. The standard deviation of the heights of a given sample of asperity peaks may be less than 8 microns, less than 6 microns, less than 5 microns, less than 4 microns, less than 3 microns or even less than 2 microns. The sample size may be at least 20 asperities, at least 30 asperities, at least 40 asperities or even at least 50 asperities.

In one embodiment, the present disclosure provides a polishing pad comprising:
i) a polishing layer having a working surface and a second surface opposite the working surface; wherein the working surface includes a land region and at least one of a plurality of precisely shaped pores and a plurality of precisely shaped asperities, the thickness of the land region is less than about 5 mm and the polishing layer comprises a polymer; ii) a porous substrate having a first major surface, an opposed second major surface and a plurality of voids and; iii) an interfacial region wherein a portion of the polymer of the polishing layer is embedded in the at least a portion of the voids of the porous substrate.

Figure 2A:
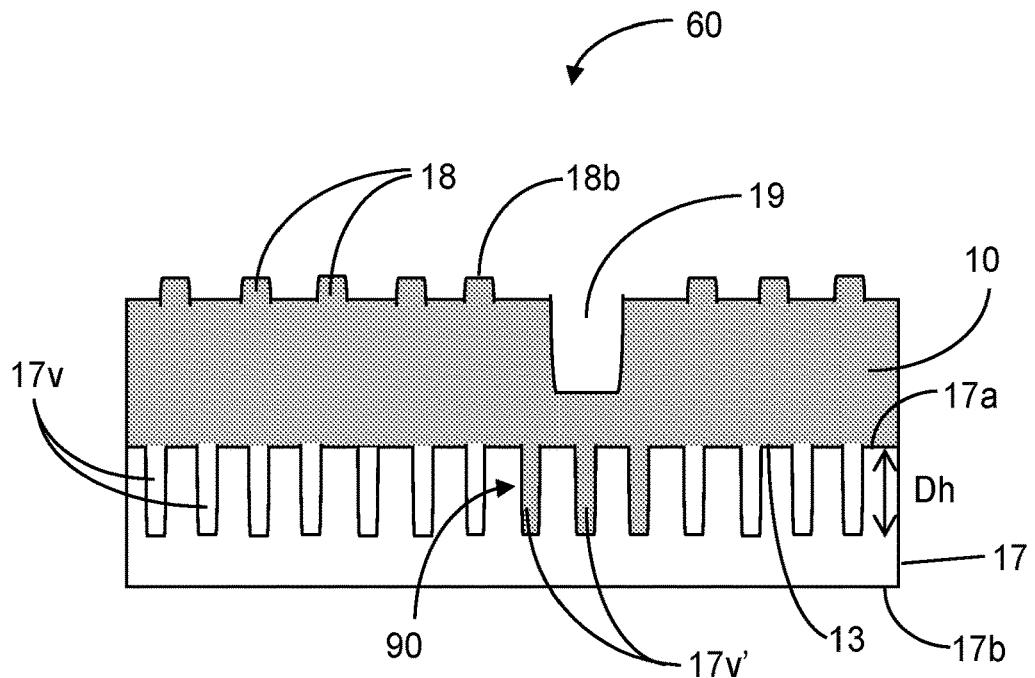
FIG. 2A is a schematic cross-sectional diagram of a portion of a polishing pad, in accordance with some embodiments of the present disclosure.

FIG. 2A is a schematic cross-sectional diagram of a portion of a polishing pad, in accordance with some embodiments of the present disclosure. Polishing pad 60 includes polishing layer 10, porous substrate 17 and interfacial region 90. Polishing layer 10 may be any one of the previously disclosed polishing layers. In this exemplary embodiment, polishing layer 10 includes precisely shaped asperities 18 having distal ends 18b and second surface 13. Polishing layer 10 also includes macro-channel 19. Porous substrate 17 has first major surface 17a and opposed second major surface 17b, and a plurality of voids 17v and 17v', having a depth Dh. Voids 17v' include polymer from polishing layer 10, forming interfacial region 90. Interfacial region 90 aligns, through the thickness of the polishing pad, with macro-channel 19. In this embodiment, porous substrate 17 may be a film substrate having a plurality of voids, e.g. a plurality of holes.

Figure 2B:
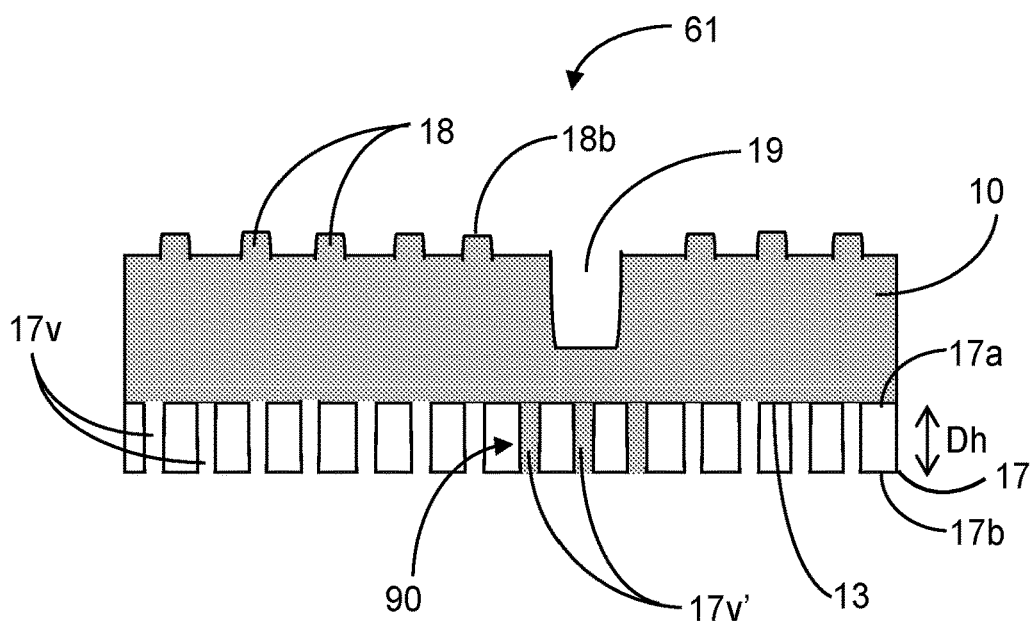
FIG. 2B is a schematic cross-sectional diagram of a portion of a polishing pad, in accordance with some embodiments of the present disclosure.

FIG. 2B is a schematic cross-sectional diagram of a portion of a polishing pad, in accordance with some embodiments of the present disclosure. Polishing pad 61 includes polishing layer 10, porous substrate 17 and interfacial region 90. Polishing layer 10 may be any one of the previously disclosed polishing layers. In this exemplary embodiment, polishing layer 10 includes precisely shaped asperities 18 having distal ends 18b and second surface 13. Polishing layer 10 also includes macro-channel 19. Porous substrate 17 has first major surface 17a and opposed second major surface 17b, and a plurality of voids 17v and 17v', having a depth Dh. Voids 17v' include polymer from polishing layer 10, forming interfacial region 90. Interfacial region 90 aligns, through the thickness of the polishing pad, with macro-channel 19. In this embodiment, porous substrate 17 may be a film substrate having a plurality of voids, e.g. a plurality of through holes.

Figure 2C:
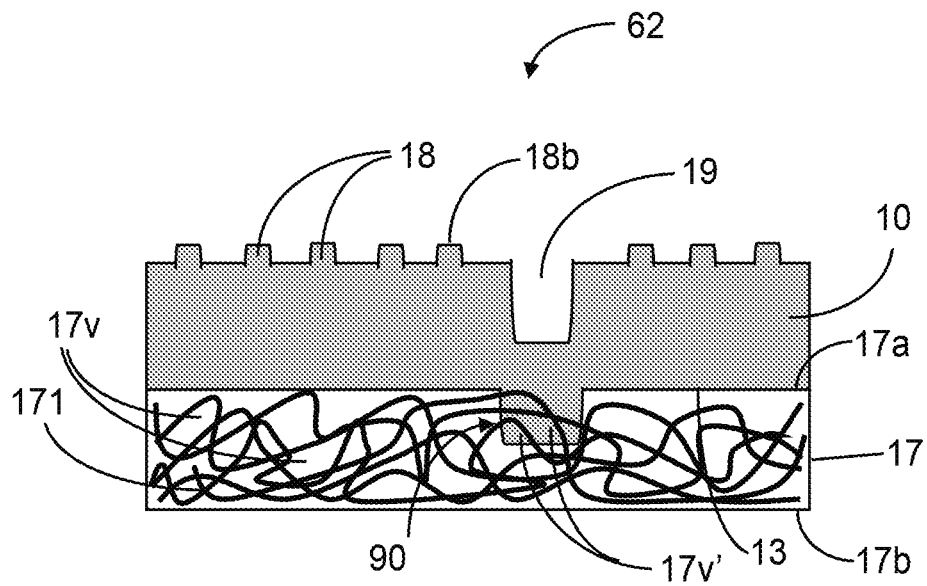
FIG. 2C is a schematic cross-sectional diagram of a portion of a polishing pad, in accordance with some embodiments of the present disclosure.

FIG. 2C is a schematic cross-sectional diagram of a portion of a polishing pad, in accordance with some embodiments of the present disclosure. Polishing pad 62 includes polishing layer 10, porous substrate 17 and interfacial region 90. Polishing layer 10 may be any one of the previously disclosed polishing layers. In this exemplary embodiment, polishing layer 10 includes precisely shaped asperities 18 having distal ends 18b and second surface 13. Polishing layer 10 also includes macro-channel 19. Porous substrate 17 has first major surface 17a and opposed second major surface 17b, and a plurality of voids 17v and 17v'. Voids 17v' include polymer from polishing layer 10, forming interfacial region 90. Interfacial region 90 aligns, through the thickness of the polishing pad, with macro-channel 19. Interfacial region 90 is located, predominantly, below macro-channel 19, i.e. interfacial region 90 aligns, through the thickness of the polishing pad, with macro-channel 19. In this embodiment, porous substrate 17 may be a non-woven substrate having a plurality of voids 17v' and fibers 171.

Figure 2D:
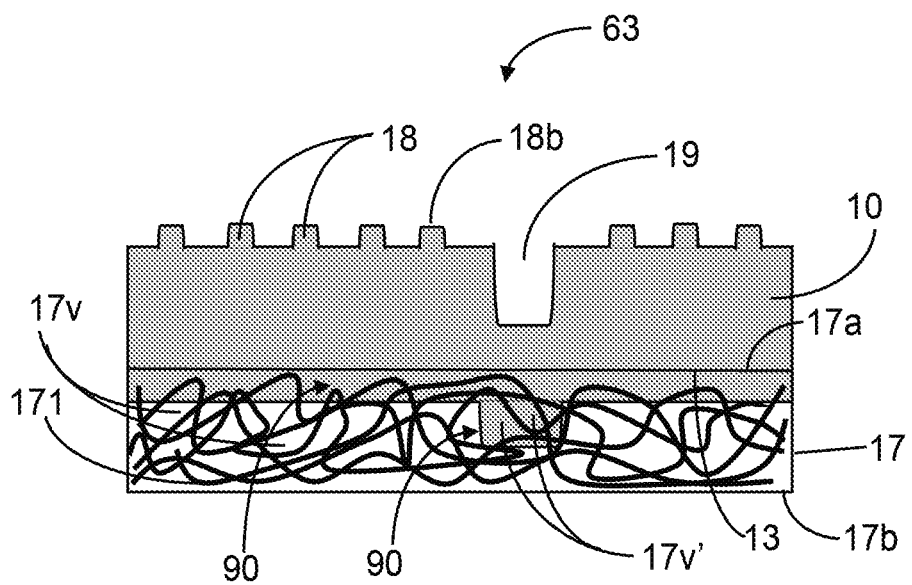
FIG. 2D is a schematic cross-sectional diagram of a portion of a polishing pad, in accordance with some embodiments of the present disclosure.

FIG. 2D is a schematic cross-sectional diagram of a portion of a polishing pad, in accordance with some embodiments of the present disclosure. Polishing pad 63 includes polishing layer 10, porous substrate 17 and interfacial region 90. Polishing layer 10 may be any one of the previously disclosed polishing layers. In this exemplary embodiment, polishing layer 10 includes precisely shaped asperities 18 having distal ends 18b and second surface 13. Polishing layer 10 also includes macro-channel 19. Porous substrate 17 has first major surface 17a and opposed second major surface 17b, and a plurality of voids 17v and 17v'. Voids 17v' include polymer from polishing layer 10, forming interfacial region 90. Interfacial region 90 is located below macro-channel 19 and across the entire interface between polishing layer 10 and porous substrate 17. In this embodiment, porous substrate 17 may be a non-woven substrate having a plurality of voids 17v and fibers 171.

Figure 2E:
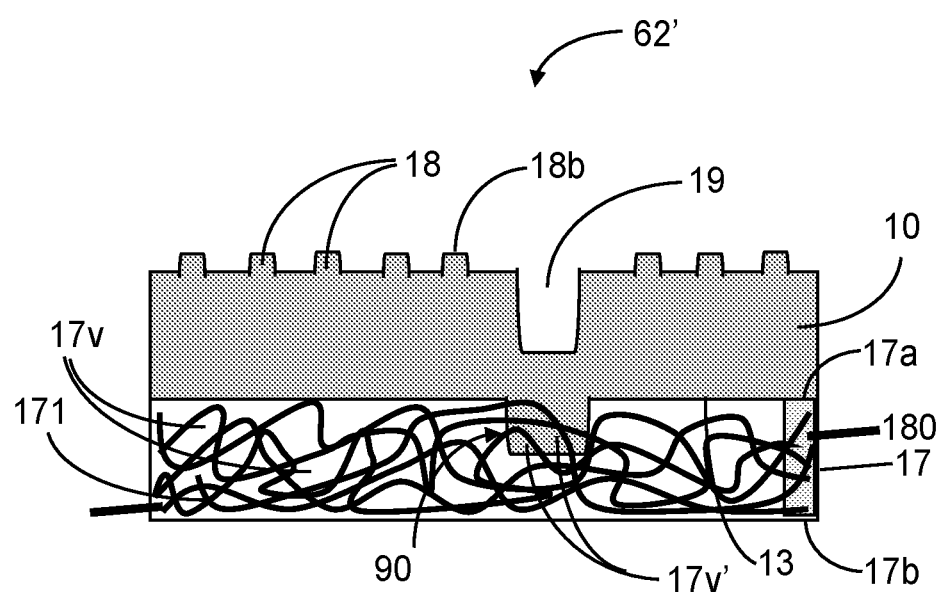
FIG. 2E is a schematic cross-sectional diagram of a portion of a polishing pad, in accordance with some embodiments of the present disclosure.

In some embodiments, the porous substrate of the polishing pads of the present disclosure may include an edge seal compound that seals a least a portion of the circumference of the porous substrate. The edge seal compound may seal at least a portion of the circumference of the porous substrate from, for example, a fluid, e.g. at least one of a gas or liquid, e.g. a polishing solution such as a slurry. FIG. 2E is a schematic cross-sectional diagram of a portion of a polishing 63, which is identical to polishing pad 62, except the porous substrate 17 of polishing pad 63 further includes edge seal compound 180. Edge seal compound 180 may seal at least a portion of the circumference of the porous substrate. Edge seal compound 180 prevents or slows the absorption or wicking of, for example, a liquid (e.g. polishing solution), into the porous substrate when the polishing pad is being used in the presence of a liquid, e.g. polishing solution. Sealing of at least a portion of the circumference of the porous substrate, prevents or minimizes changes in the mechanical properties of the polishing pad which would result, if the porous substrate was allowed to absorb fluid. In some embodiments, the edge seal compound may seal at least a portion of the circumference of the porous substrate. In some embodiments, the edge seal compound may seal at least about 30%, at least about 50%, at least about 70%, at least about 80%, at least about 90%, at least about 95%, at least about 97%, at least about 99% or even at least 100% of the circumference of the porous substrate.

The edge seal compound may be at least one of a sealant, caulk and adhesive, as known in the art. The edge seal compound may be resistant to liquids, for example, the edge seal compound may be resistant to at least one of water, polishing solution, e.g. slurry, and solvents. In some embodiments, the edge seal compound is hydrophobic. The edge seal compound may be a solid polymer. The edge seal compound may include, but is not limited to, polyurethane, epoxy resin, silicone resin, acrylate resin, polysulfide and the like. In some embodiments, the edge seal compound may include a hot melt or cure in place adhesive. In some embodiments, the edge seal compound may include and elastomer, e.g. a rubber. The elastomer may be formed after applying an edge seal compound precursor, e.g. a elastomer composition precursor, to at least a portion of the circumference of the porous substrate, up to and including the entire circumference of the porous substrate, and then curing, e.g. vulcanizing, the elastomer composition precursor. The edge seal compound may be applied to the circumference of the porous substrate by known techniques in the art, e.g. spray coating, blade coating and extrusion. The edge seal compound may coat the outer edge of the circumference of the porous substrate, may be embedded in the pores of the porous substrate in the circumference region of the porous substrate or a combination thereof. In some embodiments, the edge seal compound may initially be in the form of an edge seal compound precursor, e.g. an edge sealing compound precursor formed, for example, from a polymer dissolved in an appropriate solvent. After solvent removal, via drying for example, the edge seal compound may be formed. In some embodiments, the edge seal compound precursor may be a compound capable of being cured, the edge seal compound being formed by curing the edge seal compound precursor. In some embodiments, curing may include at least one of thermal cure, actinic radiation cure, e.g. at least one of UV and light cure, and moisture cure.

The thickness of the interfacial region, i.e. how far the interfacial region penetrates into the porous substrate, may depend on the topography of the polishing layer, e.g. at least one of the depth, height, width and length, of at least one of the asperities, pores and macro-channel(s) of the polishing layer. Although the thickness of the interfacial region is not particularly limited, in some embodiments, in order to have an acceptable bond strength between the polishing layer and porous substrate, the thickness of at least a portion of the interfacial region may be at least about 5 microns, at least about 10 microns, at least about 20 microns, at least about 25 microns, at least about 30 microns, at least about 40 microns or even at least about 50 microns and no greater than the thickness of the porous substrate or no greater than twice the thickness of the porous substrate. In some embodiments, the thickness of at least a portion the interfacial region aligned, through the thickness of the polishing pad, with at least one macro-channel may be at least about 5 microns, at least about 10 microns, at least about 20 microns, at least about 25 microns, at least about 30 microns, at least about 40 microns or even at least about 50 microns and no greater than the thickness of the porous substrate or no greater than twice the thickness of the porous substrate. The maximum thickness of the interfacial region may coincide with the maximum height of at least one of an asperity, the maximum depth of a pore and the maximum depth macro-channel. In some embodiments, the thickness of at least a portion of the interfacial region is between about 10 microns and about 10 mm, between about 10 microns and about 5 mm, between about 10 microns and about 3 mm, between about 10 microns and about 1000 micron, between about 10 microns and about 800 microns, between about 10 microns and about 600 microns, between about 10 microns and about 400 microns, 25 microns and about 10 mm, between about 25 microns and about 5 mm, between about 25 microns and about 3 mm, between about 25 microns and about 1000 microns, between about 25 microns and about 800 microns, between about 25 microns and about 600 microns, between about 25 microns and about 400 microns, 50 microns and about 10 mm, between about 50 microns and about 5 mm, between about 50 microns and about 3 mm, between about 50 microns and about 1000 microns, between about 50 microns and about 800 microns, between about 50 microns and about 600 microns or even between about 50 microns and about 400 microns.

The polishing layer may include at least one macro-channel or macro-grooves, e.g. macro-channel 19 of FIG. 1 and FIGS. 2A-2E. The at least one macro-channel may provide improved polishing solution distribution, polishing layer flexibility as well as facilitate swarf removal from the polishing pad. Unlike pores, the macro-channels or macro-grooves do not allow fluid to be contained indefinitely within the macro-channel, fluid can flow out of the macro-channel during use of the pad. The macro-channels are generally wider and have a greater depth than the precisely shaped pores. As the thickness of the land region, Y, must be greater than the depth of the plurality of precisely shaped pores, the land region is generally of greater thickness than other abrasive articles known in the art that may have only asperities. Having a thicker land region increases the polishing layer thickness. By providing one or more macro-channels with a secondary land region (defined by base 19*a*), having a lower thickness, Z, increased flexibility of the polishing layer may be obtained.

In some embodiments, at least a portion of the base of the at least one macro-channel include one or more secondary pores (not shown in FIG. 1), the secondary pore openings being substantially coplanar with base 19*a* of macro-channel 19. Generally, this type of polishing layer configuration may not be as efficient as others disclosed herein, as the secondary pores may be formed too far away from the distal ends of the precisely shape asperities. Subsequently, the polishing fluid contained in the pores may not be close enough to the interface between the distal ends of the precisely shaped asperities and the substrate being acted upon, e.g. a substrate being polished, and the polishing solution contained therein is less affective. In some embodiments, at least about 5%, at least about 10%, at last 30%, at least about 50%, at least about 70%, at least about 80%, at least about 90%, at least about 99% or even at least about 100% of the total surface area of the plurality of precisely shaped pore openings is not contained in the at least one macro-channel.

The width of the at least one macro-channel may be greater than about 10 microns, greater than about 50 microns or even greater than about 100 microns. The width of the macro-channels may be less than about 20 mm, less than about 10 mm, less than about 5 mm, less than about 2 mm, less than about 1 mm, less than about 500 microns or even less than about 200 microns. The depth of the at least one macro-channel may be greater than about 50 microns, greater than about 100 microns, greater than about 200 microns, greater than about 400 microns, greater than about 600 microns, greater than about 800 microns, greater than about 1 mm or even greater than about 2 mm. In some embodiments, the depth of the at least one macro-channels is no greater than the thickness of the land region. In some embodiments, the depth of at least a portion of the at least one macro-channel is less than the thickness of the land region adjacent the portion of the at least one macro-channel. The depth of the at least one macro-channel may be less than about 15 mm, less than about 10 mm, less than about 8 mm, less than about 5 mm, less than about 3 mm or even less than about 1 mm.

In some embodiments, the depth of at least a portion of the at least one macro-channel may be greater than the depth of at least a portion of the precisely shaped pores. In some embodiments, The depth of at least a portion of the at least one macro-channel may be greater than the depth of at least 5%, at least 10% at least 20%, at least 30% at least 50%, at least 70%, at least 80%, at least 90%, at least 95%, at least 99% or even at least 100% of the precisely shaped pores. In some embodiments, the width of at least a portion of the at least one macro-channel is greater than the width of at least a portion of the precisely shaped pores. In some embodiments, the width of at least a portion of the at least one macro-channel may be greater than the width of at least 5%, at least 10% at least 20%, at least 30% at least 50%, at least 70%, at least 80%, at least 90%, at least 95%, at least 99% or even at least 100% of the precisely shaped pores.

The ratio of the depth of the at least one macro-channel to the depth of the precisely shaped pores is not particularly limited. In some embodiments, the ratio of the depth of at least a portion of the at least one macro-channel to the depth of a portion of the precisely shaped pores may be greater than about 1.5, greater than about 2, greater than about 3, greater than about 5 greater than about 10, greater than about 15, greater than about 20 or even greater than about 25 and the ratio of the depth of at least a portion of the at least one macro-channel to the depth of at least a portion of the precisely shaped pores may be less than about 1000, less than about 500, less than about 250, less than about 100 or even less than about 50. In some embodiments, the ratio of the depth of at least a portion of the at least one macro-channel to the depth of a portion of the precisely shaped pores may be between about 1.5 and about 1000, between about 5 and 1000, between about 10 and about 1000, between about 15 and about 1000, between about 1.5 and 500, between about 5 and 500, between about 10 and about 500, between about 15 and about 500, between about 1.5 and 250, between about 5 and 250, between about 10 and about 250, between about 15 and about 250, between about 1.5 and 100, between about 5 and 100, between about 10 and about 100, between about 15 and about 100, between about 1.5 and 50, between about 5 and 50, between about 10 and about 50, and even between about 15 and about 5. The portion of precisely shaped pores to which these ratios applies may include at least 5%, at least 10% at least 20%, at least 30% at least 50%, at least 70%, at least 80%, at least 90%, at least 95%, at least 99% or even at least 100% of the precisely shaped pores.

The ratio of the width of the at least one macro-channel to the width of a pore is not particularly limited. In some embodiments, the ratio of the width of a portion of the at least one macro-channel to the width of a portion of the precisely shaped pores, e.g. the diameter if the pores have a circular cross-section with respect to the lateral dimension of the pad, may be greater than about 1.5, greater than about 2, greater than about 3, greater than about 5 greater than about 10, greater than about 15, greater than about 20 or even greater than about 25 and the ratio of the width of at least a portion of the at least one macro-channel to the width of at least a portion of the precisely shaped pores may be less than about 1000, less than about 500, less than about 250, less than about 100 or even less than about 50. In some embodiments, the ratio of the width of at least a portion of the at least one macro-channel to the width of a portion of the precisely shaped pores may be between about 1.5 and about 1000, between about 5 and 1000, between about 10 and about 1000, between about 15 and about 1000, between about 1.5 and 500, between about 5 and 500, between about 10 and about 500, between about 15 and about 500, between about 1.5 and 250, between about 5 and 250, between about 10 and about 250, between about 15 and about 250, between about 1.5 and 100, between about 5 and 100, between about 10 and about 100, between about 15 and about 100, between about 1.5 and 50, between about 5 and 50, between about 10 and about 50, and even between about 15 and about 5. The portion of precisely shaped pores to which these ratios applies may include at least 5%, at least 10% at least 20%, at least 30% at least 50%, at least 70%, at least 80%, at least 90%, at least 95%, at least 99% or even at least 100% of the precisely shaped pores.

Figure 3:
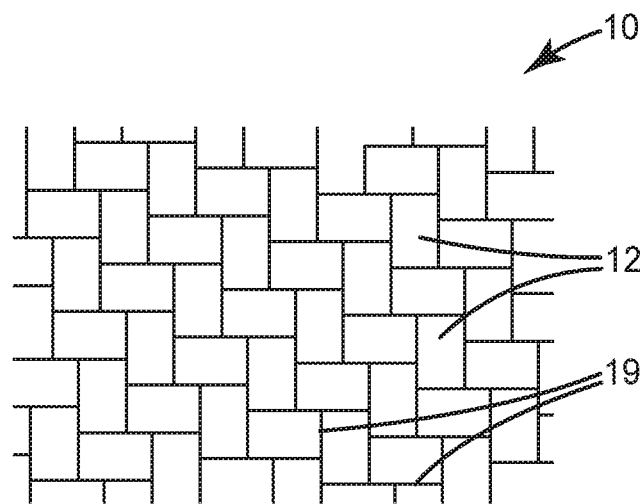
FIG. 3 is a top view schematic diagram of a portion of a polishing layer in accordance with some embodiments of the present disclosure.

The macro-channels may be formed into the polishing layer by any known techniques in the art including, but not limited to, machining, embossing and molding. Due to improved surface finish on the polishing layer (which helps minimize substrate defects, e.g. scratches, during use) embossing and molding are preferred. In some embodiments, the macro-channels are fabricated in the embossing process used to form the precisely shaped pores and/or asperities. This is achieved by forming their negative, i.e. raised regions, in the master tool, with the macro-channels themselves then being formed in the polishing layer during embossing. This is of particular advantage, as the at least one of the plurality of precisely shaped pores and the plurality of precisely shaped asperities, and macro-channels may be fabricated into the polishing layer in a single process step, leading to cost and time savings. The macro-channels can be fabricated to form various patterns known in the art, including but not limited to concentric rings, parallel lines, radial lines, a series of lines forming a grid array, spiral and the like. Combinations of differing patterns may be used. FIG. 3 shows a top view schematic diagram of a portion of a polishing layer 10 in accordance with some embodiments of the present disclosure. Polishing layer 10 includes working surfaces 12 and macro-channels 19. The macro-channels are provided in a herringbone pattern. The herringbone pattern of FIG. 3 is similar to that which was formed in the polishing layer 10 shown in FIG. 7. With respect to FIG. 7, the herringbone pattern formed by the macro-channels 19 creates rectangular "cell" sizes, i.e. areas of working surfaces 12, of about 2.5 mm×4.5 mm. The macro-channels provide a secondary land region corresponding to macro-channel base 19a (FIG. 1). The secondary land region has a lower thickness, Z, than land region 14 and facilitates the ability of individual regions or "cells" of working surfaces 12 (see FIGS. 7 and 9) to move independently in the vertical direction. This may improve local planarization during polishing.

The working surface of the polishing layer may further include nanometer-size topographical features on the surface of the polishing layer. As used herein, "nanometer-size topographical features" refers to regularly or irregularly shaped domains having a length or longest dimension no greater than about 1,000 nm. In some embodiments, the precisely shaped asperities, the precisely shaped pores, the land region, secondary land region or any combination thereof includes nanometer-size topographical features on their surface. In one embodiment, the at least one of the plurality of precisely shaped pores and the plurality of precisely shaped asperities, and the land region include nanometer-size topographical features on their surfaces. It is thought that this additional topography increases the hydrophilic properties of the pad surface, which is believed to improve slurry distribution, wetting and retention across the polishing pad surface. The nanometer-size topographical features can be formed by any known method in the art, including, but not limited to, plasma processing, e.g. plasma etching, and wet chemical etching, Plasma processes include processes described in U.S. Pat. No. 8,634,146 (David, et. al.) and U.S. Provisional Appl. No. 61/858,670 (David, et. al.), which are incorporated herein by reference in their entirety. In some embodiments, the nanometer-size features may be regularly shaped domains, i.e. domains with a distinct shape such as circular, square, hexagonal and the like, or the nanometer-size features may be irregularly shaped domains. The domains may be arranged in a regular array, e.g. hexagonal array or square array, or they may be in a random array. In some embodiments, the nanometer-size topographical features on the working surface of the polishing layer may be a random array of irregularly shaped domains. The length scale of the domains, i.e. the longest dimension of the domains, may be less than about 1,000 nm, less than about 500 nm, less than about 400 nm, less than about 300 nm, less than about 250 nm, less than about 200 nm, less than about 150 nm or even less than about 100 nm. The length scale of the domains may be greater than about 5 nm, greater than about 10 nm, greater than about 20 nm or even greater than about 40 nm. The height of the domains may be less than about 250 nm, less than about 100 nm, less than about 80 nm, less than about 60 nm or even less than about 40 nm. The height of the domains may be greater than about 0.5 nm, greater than about 1 nm, greater than about 5 nm, greater than about 10 nm or even greater than about 20 nm. In some embodiments, the nanometer-sized features on the working surface of the polishing layer include regular or irregularly shaped grooves, separating the domains. The width of the grooves may be less than about 250 nm, less than about 200 nm, less than about 150 nm, less than about 100 nm, less than about 80 nm, less than about 60 nm or even less than about 40 nm. The width of the grooves may be greater than about 1 nm, greater than about 5 nm, greater than about 10 nm or even greater than about 20 nm. The depth of the grooves may be less than about 250 nm, less than about 100 nm, less than about 80 nm, less than about 60 nm, less than about 50 nm or even less than about 40 nm. The depth of the grooves may be greater than about 0.5 nm, greater than about 1 nm, greater than about 5 nm, greater than about 10 nm or even greater than about 20 nm. The nanometer-size topographical features are considered to be non-regenerating, i.e. they cannot be formed or reformed by either the polishing process or a conventional conditioning process, e.g. use of a diamond pad conditioner in a conventional CMP conditioning process.

The nanometer-size topographical features may change the surface properties of the polishing layer. In some embodiments, the nanometer-size topographical features increase the hydrophilicity, i.e. the hydrophilic properties, of the polishing layer. The nanometer-size topographical features may include a hydrophilic surface at the top surface of the features and a hydrophobic surface at the base of the grooves of the nanometer-size topographical features. One of the benefits of including the nanometer-size topographical features on the precisely shaped asperity surfaces, the precisely shaped pore surfaces, land region and/or secondary land region surfaces is that, if the nanometer-size topographical features are worn away from the surface of the asperities during the polishing process, the positive benefits of the nanometer-size topographical features, which include increasing the hydrophilic properties across the pad surface, i.e. working surface of the polishing layer, can be maintained, as the nanometer-size topographical features will not be worn away from the precisely shaped pore surfaces and/or land region surfaces during polishing. Thus, a polishing layer can be obtained having the surprising effect of good surface wetting characteristics even though the precisely shaped asperities surfaces in contact with the substrate being polished, i.e. the precisely shaped asperities' distal ends, may have poor wetting characteristics. As such, it may be desirable to reduce the total surface area of the distal ends of the precisely shaped asperities relative to the surface area of the precisely shaped pore openings, and/or land region. Another benefit of including the nanometer-size topographical features on the precisely shaped asperity surfaces, the precisely shaped pore surfaces, land region and/or secondary land region surfaces is that the width of the grooves of the nanometer-size topographical features may be on the order of the size of some slurry particles used in CMP polishing solutions and thus may enhance polishing performance by retaining some of the slurry particles within the grooves and subsequently within the working surface of the polishing layer.

In some embodiments, the ratio of the surface area of the distal ends of the precisely shaped asperities to the surface area of the precisely shaped pore openings is less than about 4, less than about 3, less than about 2, less than about 1, less than about 0.07, less than about 0.5, less than about 0.4, less than about 0.3, less than about 0.25, less than about 0.20, less than about 0.15, less than about 0.10, less than about 0.05, less than about 0.025, less than about 0.01 or even less than about 0.005. In some embodiments, the ratio of the surface area of the distal ends of the precisely shaped asperities to the surface area of the precisely shaped pore openings may be greater than about 0.0001, greater than about 0.0005, greater than about 0.001, greater than about 0.005, greater than about 0.01, greater than about 0.05 or even greater than about 0.1. In some embodiments, the ratio of the surface area of the asperity bases of the precisely shaped asperities to the surface area of the precisely shaped pore openings is the same as described for the ratio of the surface area of the distal ends of the precisely shaped asperities to the surface area of the precisely shaped pore openings.

In some embodiments, the ratio of the surface area of the distal ends of the precisely shaped asperities to the total projected polishing pad surface, less than about 0.7, less than about 0.5, less than about 0.4, less than about 0.3, less than about 0.25, less than about 0.2, less than about 0.15, less than about 0.1, less than about 0.05, less than about 0.03, less than about 0.01, less than about 0.005 or even less than about 0.001. In some embodiments, the ratio of the surface area of the distal ends of the precisely shaped asperities to the total projected polishing pad surface area may be greater than about 0.0001, greater than about 0.0005, greater than about 0.001, greater than about 0.005, greater than about 0.01, greater than about 0.05 or even greater than about 0.1. In some embodiments, the ratio of the surface area of the distal ends of the precisely shaped asperities to the total projected polishing pad surface area may be between about 0.0001 and about 0.7, between about 0.0001 and about 0.5, between about 0.0001 and about 0.3, between about 0.0001 and about 0.2, between about 0.0001 and about 0.1, between about 0.0001 and about 0.05, between about 0.0001 and about 0.03, between about 0.001 and about 2, between about 0.001 and about 0.1, between about 0.001 and about 0.5, between about 0.001 and about 0.2, between about 0.001 and about 0.1, between about 0.001 and about 0.05, between about 0.001 and about 0.2, between about 0.001 and about 0.1, between about 0.001 and about 0.05 and even between about 0.001 and about 0.03. In some embodiments, the ratio of the surface area of the asperity bases of the precisely shaped asperities to the total projected surface area of the polishing pad is the same as described for the ratio of the surface area of the distal ends of the precisely shaped asperities to the total projected surface area of the polishing pad.

In some embodiments, the ratio of the surface area of the distal ends of the precisely shaped asperities to the surface area of the land region is less than about 0.5, less than about 0.4, less than about 0.3, less than about 0.25, less than about 0.20, less than about 0.15, less than about 0.10, less than about 0.05, less than about 0.025 or even less than about 0.01; greater than about 0.0001, greater than about 0.001 or even greater than about 0.005. In some embodiments, the ratio of the surface area of the distal ends of the precisely shaped asperities to the projected surface area of the precisely shaped pores and the surface area of the land region is less than about 0.5, less than about 0.4, less than about 0.3, less than about 0.25, less than about 0.20, less than about 0.15, less than about 0.10, less than about 0.05, less than about 0.025 or even less than about 0.01; greater than about 0.0001, greater than about 0.001 or even greater than about 0.005. In some embodiments, the ratio of the surface area of the asperity bases of the precisely shaped asperities to the surface area of the land region is the same as described for the ratio of the surface area of the distal ends of the precisely shaped asperities to the surface area of the land region.

Figure 1B:
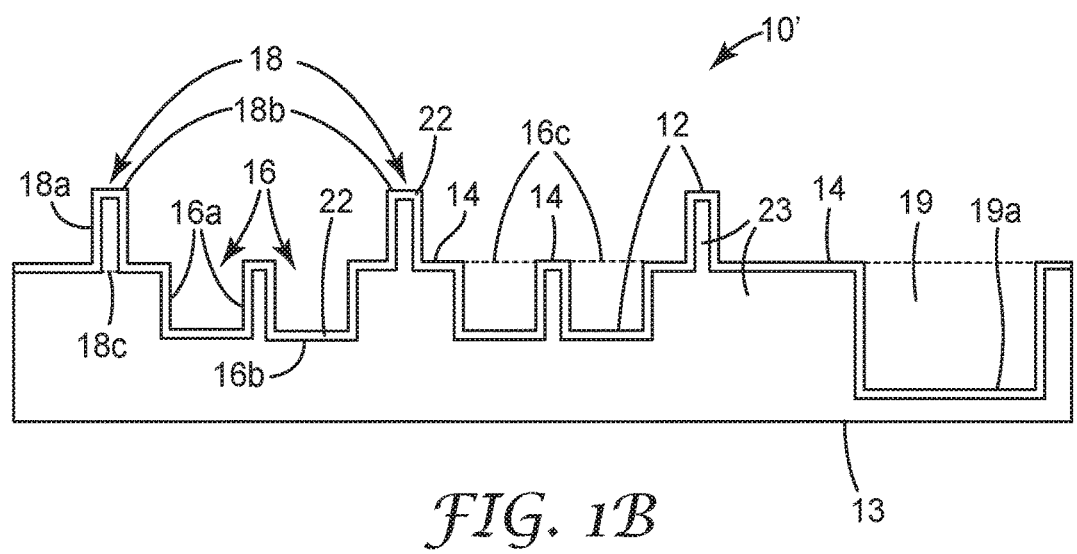
FIG. 1B is a schematic cross-sectional diagram of a portion of a polishing layer, in accordance with some embodiments of the present disclosure.

In some embodiments, surface modification techniques, which may include the formation of nanometer-size topographical features, may be used to chemically alter or modify the working surface of the polishing layer. The portion of the working surface of the polishing layer that is modified, e.g. that includes nanometer size topographical features, may be referred to as a secondary surface layer. The remaining portion of the polishing layer that is unmodified may be referred to as a bulk layer. FIG. 1B shows a polishing layer 10' which is nearly identical to that of FIG. 1A, except the polishing layer 10' includes a secondary surface layer 22 and corresponding bulk layer 23. In this embodiment, the working surface includes a secondary surface layer 22, i.e. the region of the surface that has been chemically altered, and a bulk layer 23, i.e. the region of the working surface adjacent the secondary surface layer which has not been chemically altered. As shown in FIG. 1B, the distal ends 18*b* of precisely shaped asperities 18 are modified to include secondary surface layer 22. In some embodiments, the chemical composition in at least a portion of the secondary surface layer 22 differs from the chemical composition within the bulk layer 23, e.g. the chemical composition of the polymer in at least a portion of the outer most surface of the working surface is modified, while the polymer beneath this modified surface has not been modified. Surface modifications may include those known in the art of polymer surface modification, including chemical modification with various polar atoms, molecules and/or polymers. In some embodiments, the chemical composition in at least a portion of the secondary surface layer 22 which differs from the chemical composition within the bulk layer 23 includes silicon. The thickness, i.e. height, of the secondary surface layer 22 is not particularly limited, however, it may be less than the height of the precisely shaped features. In some embodiments, the thickness of the secondary surface layer may be less than about 250 nm, less than about 100 nm, less than about 80 nm, less than about 60 nm, less than about 40 nm, less than about 30 nm, less than about 25 nm or even less than about 20 nm. The thickness of the secondary surface layer may be greater than about 0.5 nm, greater than about 1 nm, greater than about 2.5 nm, greater than about 5 nm, greater than about 10 nm or even greater than about 15 nm. In some embodiments, the ratio of the thickness of the secondary surface layer to the height of the precisely shaped asperities may be less than about 0.3, less than about 0.2, less than about 0.1, less than about 0.05, less than about 0.03 or even less than about 0.01; greater than about 0.0001 or even greater than about 0.001. If the precisely shaped asperities include asperities having more than one height, then the height of the tallest precisely shaped asperity is used to define the above ratio. In some embodiments greater than about 30%, greater than about 40%, greater than about 50%, greater than 60%, greater than about 70%, greater than about 80%, greater than about 90%, greater than about 95% or even about 100% of the surface area of the polishing layer includes a secondary surface layer.

In some embodiments, the thickness of the surface layer is included in the polishing layer dimensions, e.g. pore and asperity dimensions (width, length, depth and height), polishing layer thickness, land region thickness, secondary land region thickness, macro-channel depth and width.

In some embodiments, the precisely shaped asperities, the precisely shaped pores, the land region, secondary land region or any combination thereof includes a secondary surface layer. In one embodiment, the precisely shaped asperities, the precisely shaped pores and the land region include a secondary surface layer.

Figure 1C:
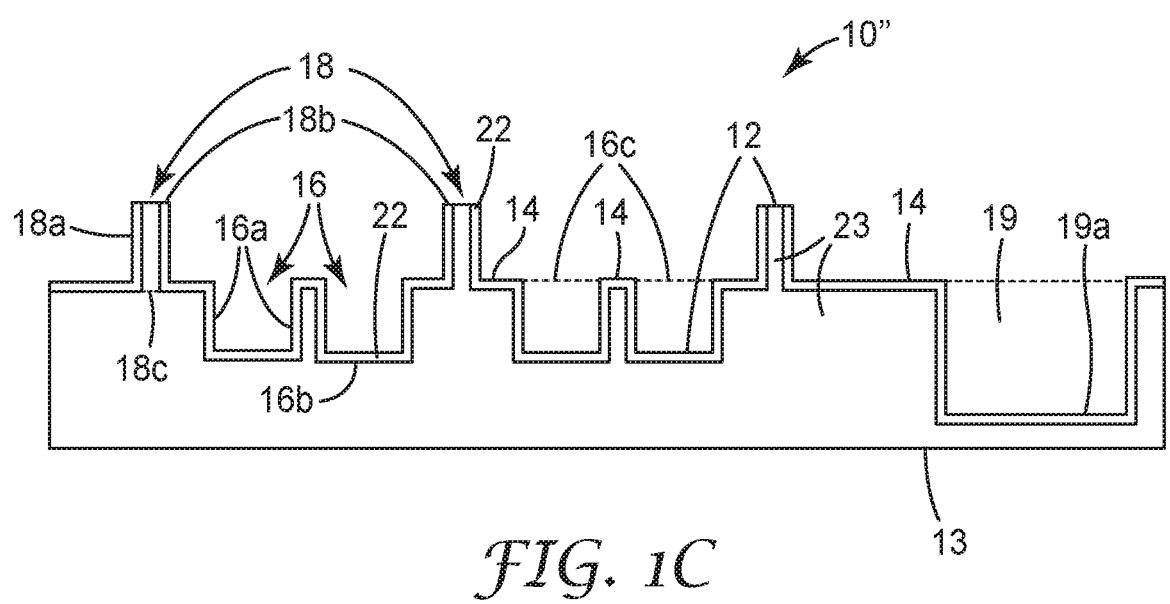
FIG. 1C is a schematic cross-sectional diagram of a portion of a polishing layer, in accordance with some embodiments of the present disclosure.

FIG. 1C shows a polishing layer 10" which is nearly identical to that of FIG. 1B, except the distal ends 18b of precisely shaped asperities 18 of polishing layer 10" do not include secondary surface layer 22. Precisely shaped asperities without secondary surface layer 22 on the distal ends 18b of precisely shaped asperities 18 may be formed by masking the distal ends during the surface modification technique, using known masking techniques, or may be produced by first forming the secondary surface layer 22 on the distal ends 18b of precisely shaped asperities 18, as shown in FIG. 1B, and then removing the secondary surface layer 22 only from the distal ends 18b by a pre-dressing process (a dressing process conducted prior to using the polishing layer for polishing) or by an in-situ dressing process (a dressing process conducted on the polishing layer during or by the actual polishing process).

In some embodiments, the working surface of the polishing layer consists essentially of precisely shaped asperities and land region, with optional secondary land region, wherein the working surface further includes a secondary surface layer and a bulk layer and, the distal ends of at least a portion of the precisely shaped asperities do not include a secondary surface layer. In some embodiments, at least about 30%, at least about 50%, at least about 70, at least about 90%, at least about 95% or even about 100% of the distal ends of the precisely shaped asperities do not include a secondary surface layer.

In some embodiments, the working surface of the polishing layer includes precisely shaped asperities, precisely shaped pores and land region, with optional secondary land region, wherein the working surface further includes a secondary surface layer and a bulk layer and, the distal ends of at least a portion of the precisely shaped asperities do not include a secondary surface layer. In some embodiments, at least about 30%, at least about 50%, at least about 70%, at least about 90%, at least about 95% or even about 100% of the distal ends of the precisely shaped asperities do not include a secondary surface layer.

The secondary surface layer may include nanometer-size topographical features. In some embodiments, the working surface of the polishing layer consists essentially of precisely shaped asperities and land region, with optional secondary land region, wherein the working surface further include nanometer-size topographical features and the distal ends of at least a portion of the precisely shaped asperities do not include nanometer-size topographical features. In some embodiments, the working surface of the polishing layer includes precisely shaped asperities, precisely shaped pores and land region, with optional secondary land region, wherein the working surface further includes nanometer-size topographical features and the distal ends of at least a portion of the precisely shaped asperities do not include nanometer-size topographical features. In some embodiments, at least about 30%, at least about 50%, at least about 70, at least about 90%, at least about 95% or even about 100% of the distal ends of the precisely shaped asperities do not include nanometer-size topographical features. Precisely shaped asperities without nanometer-size topographical features on the distal ends of the precisely shaped asperities may be formed by masking the distal ends during the surface modification technique, using known masking techniques, or may be produced by first forming nanometer-size topographical features on the distal ends of the precisely shaped asperities and then removing the nanometer-size topographical features only from the distal ends by a pre-dressing process or by an in-situ dressing process. In some embodiments, the ratio of the height of the domains of the nanometer-size topographical features to the height of the precisely shaped asperities may be less than about 0.3, less than about 0.2, less than about 0.1, less than about 0.05, less than about 0.03 or even less than about 0.01; greater than about 0.0001 or even greater than about 0.001. If the precisely shaped asperities include asperities having more than one height, then the height of the tallest precisely shaped asperity is used to define the above ratio. In some embodiments, the surface modifications result in a change in the hydrophobicity of the working surface. This change can be measured by various techniques, including contact angle measurements. In some embodiments, the contact angle of the working surface, after surface modification, decreases compared to the contact angle prior to the surface modification. In some embodiments, at least one of the receding contact angle and advancing contact angle of the secondary surface layer is less than the corresponding receding contact angle or advancing contact angle of the bulk layer, i.e. the receding contact angle of the secondary surface layer is less than the receding contact angle of the bulk layer and/or the advancing contact angle of the secondary surface layer is less than the advancing contact angle of the bulk layer. In other embodiments, at least one of the receding contact angle and advancing contact angle of the secondary surface layer is at least about 10° less than, at least about 20° less than, at least about 30° less than or even at least about 40° less than the corresponding receding contact angle or advancing contact angle of the bulk layer. For example, in some embodiments, the receding contact angle of the secondary surface layer is at least about 10° less than, at least about 20° less than, at least about 30° less than or even at least about 40° less than the receding contact angle of the bulk layer. In some embodiments, the receding contact angle of the working surface is less than about 50°, less than about 45°, less than about 40°, less than about 35°, less than about 30°, less than about 25°, less than about 20°, less than about 15°, less than about 10° or even less than about 5°. In some embodiments, the receding contact angle of the working surface is about 0°. In some embodiments the receding contact angle may be between about 0° and about 50°, between about 0° and about 45°, between about 0° and about 40°, between about 0° and about 35°, between about 0° and about 30°, between about 0° and about 25°, between about 0° and about 20°, between about 0° and about 15°, between about 0° and about 10°, or even between about 0° and about 5° In some embodiments, the advancing contact angle of the working surface is less than about 140°, less than about 135°, less than about 130°, less than about 125°, less than about 120° or even less than about 115°. Advancing and receding contact angle measurement techniques are known in the art and such measurements may be made, for example, per the "Advancing and Receding Contact Angle Measurement Test Method" described herein.

One particular benefit of including nanometer-sized features in the working surface of the polishing layer is that polymers with high contact angles, i.e. hydrophobic polymers, may be used to fabricate the polishing layer and yet the working surface can be modified to be hydrophilic, which aides in polishing performance, particularly when the working fluid used in the polishing process is aqueous based. This enables the polishing layer to be fabricated out of a large variety of polymers, i.e. polymers that may have outstanding toughness; which reduces the wear of the polishing layer, particularly the precisely shaped asperities; yet have undesirably high contact angles, i.e. they are hydrophobic. Thus, a polishing layer can be obtain having the surprising synergistic effect of both long pad life and good surface wetting characteristics of the working surface of the polishing layer, which creates improved overall polishing performance.

Figure 4A:
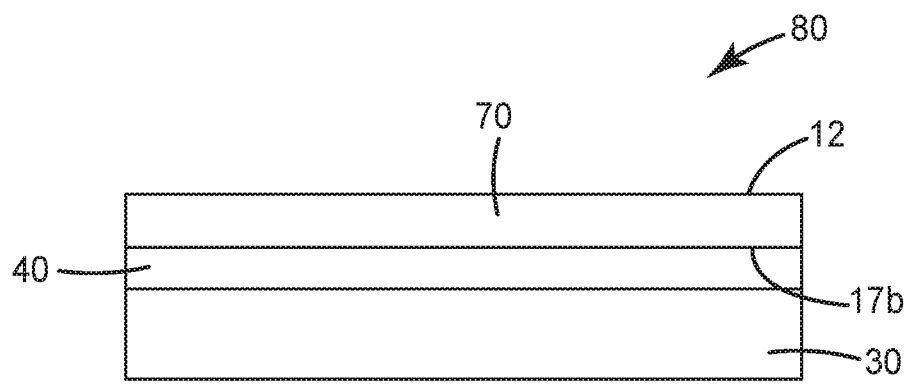
FIG. 4A is a schematic cross sectional diagram of a polishing pad in accordance with some embodiments of the present disclosure.

The polishing pad may be in the form of a film that is wound on a core and employed in a "roll to roll" format during use. The polishing pad may also be formed into individual pads, e.g. a circular shaped pad, as further discussed below. According to some embodiments of the present disclosure, the polishing pad, which includes a polishing layer a porous substrate and an interfacial region, may also include a subpad. FIG. 4A shows a polishing pad 80 which includes a polishing pad 70, according to any one of the previous polishing pads (e.g. 60, 61, 62 or 63). Polishing pad 70 includes a polishing layer, according to any of the previously described polishing layer, a porous substrate, according to any of the previously described porous substrate and an interfacial region, as previously described. Polishing pad 80 includes working surface 12 of the polishing layer and second major surface 17b of the porous substrate, and a subpad 30 adjacent to second major surface 17b. Optionally, an auxiliary foam layer 40 is interposed between the second major surface 17b of polishing pad 70 and subpad 30. The various layers of the polishing pad 80 can be adhered together by any techniques known in the art, including using adhesives, e.g. pressure sensitive adhesives (PSAs), hot melt adhesives and cure in place adhesives. In some embodiments, the polishing pad 80 includes an adhesive layer adjacent to second major surface 17b (not shown). Use of a lamination process in conjunction with PSAs, e.g. PSA transfer tapes, is one particular process for adhering the various layers of polishing pad 80. Subpad 30 may be any of those known in the art. Subpad 30 may be a single layer of a relatively stiff material, e.g. polycarbonate, or a single layer of a relatively compressible material, e.g. an elastomeric foam. The subpad 30 may also have two or more layers and may include a substantially rigid layer (e.g. a stiff material or high modulus material like polycarbonate, polyester and the like) and a substantially compressible layer (e.g. an elastomer or an elastomeric foam material). Auxiliary foam layer 40 may have a durometer from between about 20 Shore D to about 90 Shore D. Auxiliary Foam layer 40 may have a thickness from between about 125 micron and about 5 mm or even between about 125 micron and about a 1000 micron.

In some embodiments of the present disclosure, which include a subpad having one or more opaque layers, a small hole may be cut into the subpad creating a "window". The hole may be cut through the entire subpad or only through the one or more opaque layers. The cut portion of the supbad or one or more opaque layers is removed from the subpad, allowing light to be transmitted through this region. The hole is pre-positioned to align with the endpoint window of the polishing tool platen and facilitates the use of the wafer endpoint detection system of the polishing tool, by enabling light from the tool's endpoint detection system to travel through the polishing pad and contact the wafer. Light based endpoint polishing detection systems are known in the art and can be found, for example, on MIRRA and REFLEXION LK CMP polishing tools available from Applied Materials, Inc., Santa Clara, Calif. Polishing pads of the present disclosure can be fabricated to run on such tools and endpoint detection windows which are configured to function with the polishing tool's endpoint detection system can be included in the pad. In one embodiment, a polishing pad including any one of the polishing layers of the present disclosure can be laminated to a subpad. The subpad includes at least one stiff layer, e.g. polycarbonate, and at least one compliant layer, e.g. an elastomeric foam, the elastic modulus of the stiff layer being greater than the elastic modulus of the compliant layer. The compliant layer may be opaque and prevent light transmission required for endpoint detection. The stiff layer of the subpad is laminated to the second surface of the polishing layer, typically through the use of a PSA, e.g. transfer adhesive or tape. Prior to or after lamination, a hole may be die cut, for example, by a standard kiss cutting method or cut by hand, in the opaque compliant layer of the subpad. The cut region of the compliant layer is removed creating a "window" in the polishing pad. If adhesive residue is present in the hole opening, it can be removed, for example, through the use of an appropriate solvent and/or wiping with a cloth or the like. The "window" in the polishing pad is configured such that, when the polishing pad is mounted to the polishing tool platen, the window of the polishing pad aligns with the endpoint detection window of the polishing tool platen. The dimensions of the hole may be, for example, up to 5 cm wide by 20 cm long. The dimensions of the hole are, generally, the same or similar in dimensions as the dimensions of the endpoint detection window of the platen.

The polishing pad thickness is not particularly limited. The polishing pad thickness may coincide with the required thickness to enable polishing on the appropriate polishing tool. The polishing pad thickness may be greater than about 25 microns, greater than about 50 microns, greater than about 100 microns or even greater than 250 microns; less than about 20 mm, less than about 10 mm, less than about 5 mm or even less than about 2.5 mm. The shape of the polishing pad is not particularly limited. The pads may be fabricated such that the pad shape coincides with the shape of the corresponding platen of the polishing tool the pad will be attached to during use. Pad shapes, such as circular, square, hexagonal and the like may be used. A maximum dimension of the pad, e.g. the diameter for a circular shaped pad, is not particularly limited. The maximum dimension of a pad may be greater than about 10 cm, greater than about 20 cm, greater than about 30 cm, greater than about 40 cm, greater than about 50 cm, greater than about 60 cm; less than about 2.0 meter, less than about 1.5 meter or even less than about 1.0 meter. As disused above, the pad, including any one of polishing layer, the subpad, the optional axillary foam layer and any combination thereof, may include a window, i.e. a region allowing light to pass through, to enable standard endpoint detection techniques used in polishing processes, e.g. wafer endpoint detection.

In some embodiments, the polishing layer includes a polymer. Polishing layer 10 may be fabricated from any known polymer, including thermoplastics, thermoplastic elastomers (TPEs), e.g. TPEs based on block copolymers, thermosets, e.g. elastomers, and combinations thereof. If an embossing process is being used to fabricate the polishing layer 10, thermoplastics and TPEs are generally utilized for polishing layer 10. Thermoplastics and TPEs include, but are not limited to polyurethanes; polyalkylenes, e.g. polyethylene and polypropylene; polybutadiene, polyisoprene; polyalkylene oxides, e.g. polyethylene oxide; polyesters; polyamides; polycarbonates, polystyrenes, block copolymers of any of the proceeding polymers, and the like, including combinations thereof. Polymer blends may also be employed. One particularly useful polymer is a thermoplastic polyurethane, available under the trade designation ESTANE 58414, available from Lubrizol Corporation, Wickliffe, Ohio. In some embodiments, the composition of the polishing layer may be at least about 30%, at least about 50%, at least about 70%, at least about 90%, at least about 95%, at least about 99% or even at least about 100% polymer by weight.

In some embodiments, the polishing layer comprises at least one of a thermoplastic and thermoplastic elastomer. In some embodiments, the polishing layer includes a thermoplastic polymer and a thermoplastic elastomer. In some embodiments, the polishing layer is not a thermoset polymer. In some embodiments, the polishing layer includes at least about 30%, at least about 40%, at least about 50%, at least about 60%, at least about 70%, at least about 80%, at least about 85%, at least about 90%, at least about 95%, at least about 97%, at least 99% or even at least about 100% by weight of at least one of a thermoplastic and thermoplastic elastomer.

In some embodiments, the polishing layer may be a unitary sheet. A unitary sheet includes only a single layer of material (i.e. it is not a multi-layer construction, e.g. a laminate) and the single layer of material has a single composition. The composition may include multiple-components, e.g. a polymer blend or a polymer-inorganic composite. Use of a unitary sheet as the polishing layer may provide cost benefits, due to minimization of the number of process steps required to form the polishing layer. A polishing layer that includes a unitary sheet may be fabricated from techniques know in the art, including, but not limited to, molding and embossing. Due to the ability to form a polishing layer having precisely shaped asperities, precisely shaped pores and, optionally, macro-channels in a single step, a unitary sheet is preferred.

The hardness and flexibility of polishing layer 10 is predominately controlled by the polymer used to fabricate it. The hardness of polishing layer 10 is not particularly limited. The hardness of polishing layer 10 may be greater than about 20 Shore D, greater than about 30 Shore D or even greater than about 40 Shore D. The hardness of polishing layer 10 may be less than about 90 Shore D, less than about 80 Shore D or even less than about 70 Shore D. The hardness of polishing layer 10 may be greater than about 20 Shore A, greater than about 30 Shore A or even greater than about 40 Shore A. The hardness of polishing layer 10 may be less than about 95 Shore A, less than about 80 Shore A or even less than about 70 Shore A. The polishing layer may be flexible. In some embodiments the polishing layer is capable of being bent back upon itself producing a radius of curvature in the bend region of less than about 10 cm, less than about 5 cm, less than about 3 cm, or even less than about 1 cm; and greater than about 0.1 mm, greater than about, 0.5 mm or even greater than about 1 mm. In some embodiments the polishing layer is capable of being bent back upon itself producing a radius of curvature in the bend region of between about 10 cm and about 0.1 mm, between about 5 cm and bout 0.5 mm or even between about 3 cm and about 1 mm.

To improve the useful life of polishing layer 10, it is desirable to utilize polymeric materials having a high degree of toughness. This is particularly important, due to the fact the precisely shaped asperities are small in height yet need to perform for a significantly long time to have a long use life. The use life may be determined by the specific process in which the polishing layer is employed. In some embodiments, the use life time is at least about 30 minutes at least 60 minutes, at least 100 minute, at least 200 minutes, at least 500 minutes or even at least 1000 minutes. The use life may be less than about 10000 minutes, less than 5000 minutes or even less than 2000 minutes. The useful life time may be determined by measuring a final parameter with respect to the end use process and/or substrate being polished. For example, use life may be determined by having an average removal rate or having a removal rate consistency (as measure by the standard deviation of the removal rate) of the substrate being polished over a specified time period (as defined above) or producing a consistent surface finish on a substrate over a specified time period. In some embodiments, the polishing layer can provide a standard deviation of the removal rate of a substrate being polished that is between about 0.1% and 20%, between about 0.1% and about 15%, between about 0.1% and about 10%, between about 0.1% and about 5% or even between about 0.1% and about 3% over a time period from of, at least about 30 minutes, at least about 60 minutes, at least about 100 minutes, at least about 200 minutes or even at least about 500 minutes. The time period may be less than 10000 minutes. To achieve this, it is desirable to use polymeric materials having a high work to failure (also known as Energy to Break Stress), as demonstrated by having a large integrated area under a stress vs. strain curve, as measured via a typical tensile test, e.g. as outlined by ASTM D638. High work to failure may correlate to lower wear materials. In some embodiments, the work to failure is greater than about 3 Joules, greater than about 5 Joules, greater than about 10 Joules, greater than about 15 joules greater than about 20 Joules, greater than about 25 Joules or even greater than about 30 Joules. The work to failure may be less than about 100 Joules or even less than about 80 Joules.

The polymeric materials used to fabricate polishing layer 10 may be used in substantially pure form. The polymeric materials used to fabricate polishing layer 10 may include fillers known in the art. In some embodiments, the polishing layer 10 is substantially free of any inorganic abrasive material (e.g. inorganic abrasive particles), i.e. it is an abrasive free polishing pad. By substantially free it is meant that the polishing layer 10 includes less than about 10% by volume, less than about 5% by volume, less than about 3% by volume, less than about 1% by volume or even less than about 0.5% by volume inorganic abrasive particles. In some embodiments, the polishing layer 10 contains substantially no inorganic abrasive particles. An abrasive material may be defined as a material having a Mohs hardness greater than the Mohs hardness of the substrate being abraded or polished. An abrasive material may be defined as having a Mohs hardness greater than about 5.0, greater than about 5.5, greater than about 6.0, greater than about 6.5, greater than about 7.0, greater than about 7.5, greater than about 8.0 or even greater than about 9.0. The maximum Mohs hardness is generally accepted to be 10. The polishing layer 10 may be fabricated by any techniques known in the art. Micro-replication techniques are disclosed in U.S. Pat. Nos. 6,285,001; 6,372,323; 5,152,917; 5,435,816; 6,852,766; 7,091,255 and U.S. Patent Application Publication No. 2010/0188751, all of which are incorporated by reference in their entirety.

In some embodiments, the polishing layer 10 is formed by the following process. First, a sheet of polycarbonate is laser ablated according to the procedures described in U.S. Pat. No. 6,285,001, forming the positive master tool, i.e. a tool having about the same surface topography as that required for polishing layer 10. The polycarbonate master is then plated with nickel using conventional techniques forming a negative master tool. The nickel negative master tool may then be used in an embossing process, for example, the process described in U.S. Patent Application Publication No. 2010/0188751, to form polishing layer 10. The embossing process may include the extrusion of a thermoplastic or TPE melt onto the surface of the nickel negative and, with appropriate pressure, the polymer melt is forced into the topographical features of the nickel negative. Upon cooling the polymer melt, the solid polymer film may be removed from the nickel negative, forming polishing layer 10 with working surface 12 having the desired topographical features, i.e. precisely shaped pores 16 and/or precisely shaped asperities 18 (FIG. 1A). If the negative includes the appropriate negative topography that corresponds to a desired pattern of macro-channels, macro-channels may be formed in the polishing layer 10 via the embossing process.

In some embodiments, the working surface 12 of polishing layer 10 may further include nanometer-size topographical features on top of the topography formed during the micro-replication process. Processes for forming these additional features are disclosed in U.S. Pat. No. 8,634,146 (David, et. al.) and U.S. Provisional Appl. No. 61/858,670 (David, et. al.), which have previously been incorporated by reference.

The porous substrate is not particularly limited and may include at least one of a film substrate having at least one of a plurality of holes or a plurality of through holes, a woven or nonwoven substrate and an open cell foam. In some embodiments, the porous substrate does not include an open cell foam. The porous substrate may comprise a polymer. The polymers previously discussed for polishing layer, e.g. polishing layer 10, may be used to form the porous substrate. The porous substrate may comprise an inorganic material, e.g. inorganic fiber, including but not limited to metal oxides, e.g. silicon oxide (glass) and aluminum oxide, silicon carbide, carbon and the like. The porous substrate may be ceramic fiber.

The thickness of the porous substrate is not particularly limited. In some embodiments, the thicknesses of the porous substrate may be from about 10 microns to about 1000 microns, from about 10 microns to about 500 microns, from about 10 microns to about 400 microns, from about 10 microns to about 300 microns, from about 10 microns to about 200 microns, from about 25 microns to about 1000 microns, from about 25 microns to about 500 microns, from about 25 microns to about 400 microns, from about 25 microns to about 300 microns, from about 25 microns to about 200 microns, from about 50 microns to about 1000 microns, from about 50 microns to about 500 microns, from about 50 microns to about 400 microns, from about 50 microns to about 300 microns, from about 50 microns to about 200 microns, from about 65 microns to about 1000, from about 65 microns to about 500 microns, from about 65 microns to about 400 microns, from about 65 microns to about 300 microns, from about 65 microns to about 200 microns, from about 75 microns to about 1000 microns, from about 75 microns to about 500 microns, from about 75 microns to about 400 microns, from about 75 microns to about 300 microns, or even from about 75 microns to about 200 microns.

The fraction of the porous substrate that includes voids, i.e. the fractional void volume of the porous substrate, is not particularly limited. The fraction void volume of the porous substrate may be between about 0.01 to 0.99. The void volume of the porous substrate should be large enough to contain a large portion of the displaced volume of polymer from the polishing layer as the precisely shaped asperities, precisely shaped pores and/or macro-channels, are being formed, for example, through an embossing process. In some embodiments, the void volume of the porous substrate may be at least 70%, at least 80% at least 90% at least 95% or even at least 100% of the displaced volume of polymer. The displaced volume of the polymer may be localized, for example in the region below a macro-channel, therefore the void volume of the porous substrate may be significantly larger than the total displaced volume of the polymer of the porous substrate. In some embodiments, the void volume of the porous substrate may be at least 100%, at least 125%, at least 150%, at least 200%, at least 300%, at least 400% or even at least 500% of the displaced volume of polymer. In some embodiments, the void volume of the porous substrate may be less than 5000%, less than 2000%, less than 1500% or even less than 1000% of the displaced volume of polymer. In some embodiments, the volume of the plurality of voids of the porous substrate may be at least 100%, at least 125%, at least 150%, at least 200%, at least 300%, at least 400% or even at least 500% of the volume of the portion of the polymer of the polishing layer that is embedded in the at least a portion of the plurality of voids of the porous substrate and, optionally, in some embodiments, the volume of the plurality of voids of the porous substrate may be less than 5000%, less than 2000%, less than 1500%, less than 1000%, less than 800%, less than 600%, less than 500%, less than 400%, less than 300% or even less than 200% of the volume of the portion of the polymer of the polishing layer that is embedded in the at least a portion of the plurality of voids of the porous substrate.

The porous substrate may be a woven or nonwoven substrate. Woven and nonwoven substrates know in the art may be used. The woven or nonwoven substrate may include a polymer, e.g. polymer fiber, and/or and inorganic material, e.g. inorganic fiber. In some embodiments, the at least one of a woven and nonwoven substrate may be at least one of a woven and nonwoven paper, felt, mat and cloth, i.e. fabric. In some embodiments, the porous substrate includes a woven substrate and is free of a nonwoven substrate. In some embodiments, the porous substrate includes a nonwoven substrate and is free of a woven substrate. The woven and nonwoven substrate of the porous substrate may be organic, inorganic or combinations thereof. The woven and nonwoven substrate of the porous substrate may include at least one of a polymer woven and nonwoven substrate, e.g.

a polymer paper, felt, mat and/or cloth (fabric). The woven and nonwoven substrate of the porous protection layer may include at least one of an inorganic woven and nonwoven substrate, e.g. an inorganic paper, felt, mat and/or cloth (fabric). The at least one woven and nonwoven substrate may include at least one of a polymer material and an inorganic material. The woven and nonwoven substrate may comprise fiber, e.g. a plurality of fibers. The woven and nonwoven substrate may be fabricated from at least one of polymer fiber and inorganic fiber. In some embodiments, the woven and nonwoven substrate may include at least one of polymer fiber and inorganic fiber. In some embodiments, the woven and nonwoven substrate may include polymer fiber and exclude inorganic fiber. In some embodiments, the woven and nonwoven substrate may include inorganic fiber and exclude polymer fiber. In some embodiments, the woven and nonwoven substrate may include both inorganic fiber and polymer fiber.

In some embodiments, the fibers of the at least one woven and nonwoven substrate comprising fibers may have aspect ratios of the length to width and length to thickness both of which are greater about 10 and a width to thickness aspect ratio less than about 5. For a fiber having a cross sectional area that is in the shape of a circle, the width and thickness would be the same and would be equal to the diameter of the circular cross-section. There is no particular upper limit on the length to width and length to thickness aspect ratios of a fiber. Both the length to thickness and length to width aspect ratios of the fiber may be between about 10 and about 1000000, between 10 and about 100000, between 10 and about 1000, between 10 and about 500, between 10 and about 250, between 10 and about 100, between about 10 and about 50, between about 20 and about 1000000, between 20 and about 100000, between 20 and about 1000, between 20 and about 500, between 20 and about 250, between 20 and about 100 or even between about 20 and about 50. The width and thickness of the fiber may each be from between about 0.001 to about 100 microns, from between about 0.001 microns to about 50 microns, from between about 0.001 to about 25 microns, from between about 0.001 microns to about 10 microns, from about 0.001 microns to about 1 microns, from between about 0.01 to about 100 microns, from between about 0.01 microns to about 50 microns, from between about 0.01 to about 25 microns, from between about 0.01 microns to about 10 microns, from about 0.01 microns to about 1 microns, from between about 0.05 to about 100 microns, from between about 0.05 microns to about 50 microns, from between about 0.05 to about 25 microns, from between about 0.05 microns to about 10 microns, from about 0.05 microns to about 1 microns, from between about 0.1 to about 100 microns, from between about 0.1 microns to about 50 microns, from between about 0.1 to about 25 microns, from between about 0.1 microns to about 10 microns, or even from between about 0.1 microns to about 1 microns. In some embodiments the thickness and width of the fiber may be the same.

The fibers may be fabricated into at least one of a woven and nonwoven substrate using conventional techniques. A nonwoven substrate may be fabricated by a melt blown fiber process, spunbond process, a carding process and the like. In some embodiments, the length to thickness and length to width aspect ratios of the fiber may be greater than 1000000, greater than about 10000000 greater than about 100000000 or even greater than about 1000000000. In some embodiments, the length to thickness and length to width aspect ratios of the fiber may be between about 10 to about 1000000000; between about 10 and about 100000000 between about 10 and about 10000000, between about 20 to about 1000000000; between about 20 and about 100000000 between about 20 and about 10000000, between about 50 to about 1000000000; between about 50 and about 100000000 or even between about 50 and about 10000000.

The at least one of a woven and nonwoven substrate may include conventional woven and nonwoven paper, felt, mats and cloth (fabrics) known in the art. The at least one of a woven and nonwoven substrate may include at least one of polymer fiber and inorganic fiber. The number of types, i.e. polymer fiber types and/or inorganic fiber types, used to form the at least one of a woven and nonwoven substrate, is not particularly limited. The polymer fiber may include at least one polymer, e.g. one polymer composition or one polymer type. The polymer fiber may include at least two polymers, i.e. two polymer compositions or two polymer types. For example, the polymer fiber may include one set of fibers composed of polyethylene and another set of fibers composed of polypropylene. If at least two polymers are used, the first polymer fiber may have a lower glass transition temperature and or melting temperature than the second polymer fiber. The first polymer fiber may be used for fusing the polymer fiber of the at least one of a woven and nonwoven substrate together, to improve, for example, the mechanical properties of the at least one of a woven and nonwoven substrate. The inorganic fiber may include at least one inorganic, e.g. one inorganic composition or one inorganic type. The inorganic fiber may include at least two inorganics, i.e. two inorganic compositions or two inorganic types. The at least one of a woven and nonwoven substrate may include at least one of polymer fiber, e.g. one polymer composition or polymer type, and at least one inorganic fiber, e.g. one inorganic composition or one inorganic type. For example, the at least one of a woven and nonwoven substrate may include polyethylene fiber and glass fiber.

The polymer fiber of the at least one of a woven and nonwoven substrate is not particularly limited. In some embodiments, the polymer fiber of the at least one of a woven and nonwoven substrate may include least one of a thermoplastic and thermoset. Thermoplastics may include thermoplastic elastomers. A thermoset may include a B-stage polymer. In some embodiments, polymer fiber of the at least one of a woven and nonwoven substrate includes, but is not limited to, at least one of epoxy resin, phenolic resin, polyurethanes, urea-formadehyde resin, melamine resin, polyesters, e.g. polyethylene terephthalate, polyamides, polyethers, polycarbonates, polyimides, polysulphones, polyphenylene oxides, polyacrylates, polymethacylates, polyolefin, e.g. polyethylene and polypropylene, styrene and styrene based random and block copolymers, e.g. styrene-butadiene-styrene, polyvinyl chloride, and fluorinated polymers, e.g. polyvinylidene fluoride and polytetrafluoroethylene. In some embodiments, the polymer fiber comprises at least one of polyurethanes, polyesters, polyamides, polyethers, polycarbonates, polyimides, polysulphones, polyphenylene oxides, polyacrylates, polymethacylates, polyolefin, styrene and styrene based random and block copolymers, polyvinyl chloride, and fluorinated polymers.

The inorganic fiber of the at least one of a woven and nonwoven substrate is not particularly limited. In some embodiments, the inorganic fiber of the at least one of a woven and nonwoven substrate may include a ceramic. The ceramic may include, but is not limited to metal oxides, for example silicon oxide, e.g. glass and doped glass, and aluminum oxide. In some embodiments, the inorganic fiber of the at least one of a woven and nonwoven substrate includes, but is not limited to, at least one of a ceramic, e.g.

silicone oxide and aluminum oxide; boron; silicon; magnesium silicate, e.g. hydrated magnesium silicate; Wollastonite, e.g. calcium silicate, and rock wool.

The porous substrate may be a film substrate having at least one of a plurality of holes or a plurality of through holes. The width or length of the holes and through holes is not particularly limited. The depth, Dh of the holes and through holes (see FIGS. 2A and 2B) is not particularly limited, except by the thickness of the porous substrate, e.g. porous substrate 17. The shape of the holes and through holes, as viewed in the plane of the first major surface of the porous substrate is not particularly limited. The shape of the holes and through holes include, but is not limited to circular, elliptical, square, rectangular, triangular and the like. Mixtures of differing shapes may be used. The hole and through holes may be randomly placed or they may be in the form of a pattern. The pattern of the holes and through holes include, but is not limited to, square array, rectangular array and heaxagonal arrays.

The film substrates of the porous substrate are not particularly limited and may include conventional liners and release liners, e.g. polymer films that may or may not have a low surface energy coating. The polymer of the film substrate may be at least one of a thermoplastic polymer and a thermoset polymer. Thermoplastic polymers, include, but are to limited to, polyalkylenes; e.g. polyethylene and polypropylene; polyurethane; polyamide; polycarbonates; polysulfones; polystrenes; polyester, e.g. polyethylene terephthalate and polybutylene terephthalate; polybutadiene; polyisoprene; polyalkylene oxides, e.g. polyethylene oxide; ethylene vinyl acetate; cellulose acetate; ethyl cellulose and block copolymers of any of the proceeding polymers. Thermoset polymers include, but are not limited to, polyimide, polyurethanes, polyesters, epoxy resins, phenol-formaldehyde resins, urea formaldehyde resins and rubber. In some embodiments, the film substrate is a dielectric polymer, film substrate. The polymer of the film substrate may be a polymer blend.

The number and areal density of the plurality of holes and/or through holes is not particularly limited. In some embodiments, the ratio of the surface area of the plurality of holes and/or through holes, i.e. the sum of the projected surface of each hole onto the surface (first or second major surface) of the film substrate, to the total surface area of the film substrate (first or second major surface) is from about 0.01 to about 0.90, from about, 0.01 to about 0.80 from about 0.01 to about 0.70, from about 0.05 to about 0.90, from about, 0.05 to about 0.80 from about 0.05 to about 0.70, from about 0.1 to about 0.90, from about, 0.1 to about 0.80 from about 0.1 to about 0.70, from about 0.2 to about 0.90, from about, 0.2 to about 0.80 from about 0.2 to about 0.70, from about 0.3 to about 0.90, from about, 0.3 to about 0.80 ore even from about 0.3 to about 0.70. In some embodiments, the width and/or length of the individual holes and/or through holes of the plurality of holes and/or plurality of through holes, respectively is from about 5 microns to about 5 mm, from about 5 microns to about 2.5 mm, from about 5 microns from about 1 mm, from about 5 microns to about 500 microns, from about 25 microns to about 5 mm, from about 25 microns to about 2.5 mm, from about 25 microns to about 1 mm, from about 25 microns to about 500 microns, from about 50 microns to about 5 mm, from about 50 microns to about 2.5 mm, from about 50 microns to about 1 mm, from about 50 microns to about 500 microns, from about 100 microns to about 5 mm, from about 100 microns to about 2.5 mm, from about 100 microns to about 1 mm or even from about 5 microns to about 100 microns. In some embodiments, the plurality of holes and/or through holes may be in the form of a pattern.

The porous substrate may include an open cell foam. Open cell foams known in the art may be used.

In another embodiment the present disclosure relates to a polishing system, the polishing system includes any one of the previous polishing pads and a polishing solution. The polishing pads may include any of the previous disclosed polishing layers 10 and porous substrates 17 and interfacial region. The polishing solutions used are not particularly limited and may be any of those known in the art. The polishing solutions may be aqueous or non-aqueous. An aqueous polishing solution is defined as a polishing solution having a liquid phase (does not include particles, if the polishing solution is a slurry) that is at least 50% by weight water. A non-aqueous solution is defined as a polishing solution having a liquid phase that is less than 50% by weight water. In some embodiments, the polishing solution is a slurry, i.e. a liquid that contains organic or inorganic abrasive particles or combinations thereof. The concentration of organic or inorganic abrasive particles or combination thereof in the polishing solution is not particularly limited. The concentration of organic or inorganic abrasive particles or combinations thereof in the polishing solution may be, greater than about 0.5%, greater than about 1%, greater than about 2%, greater than about 3%, greater than about 4% or even greater than about 5% by weight; may be less than about 30%, less than about 20% less than about 15% or even less than about 10% by weight. In some embodiments, the polishing solution is substantially free of organic or inorganic abrasive particles. By "substantially free of organic or inorganic abrasive particles" it is meant that the polishing solution contains less than about 0.5%, less than about 0.25%, less than about 0.1% or even less than about 0.05% by weight of organic or inorganic abrasive particles. In one embodiment, the polishing solution may contain no organic or inorganic abrasive particles. The polishing system may include polishing solutions, e.g. slurries, used for silicon oxide CMP, including, but not limited to, shallow trench isolation CMP; polishing solutions, e.g. slurries, used for metal CMP, including, but not limited to, tungsten CMP, copper CMP and aluminum CMP; polishing solutions, e.g. slurries, used for barrier CMP, including but not limited to tantalum and tantalum nitride CMP and polishing solutions, e.g. slurries, used for polishing hard substrates, such as, sapphire. The polishing system may further include a substrate to be polished or abraded.

Figure 4B:
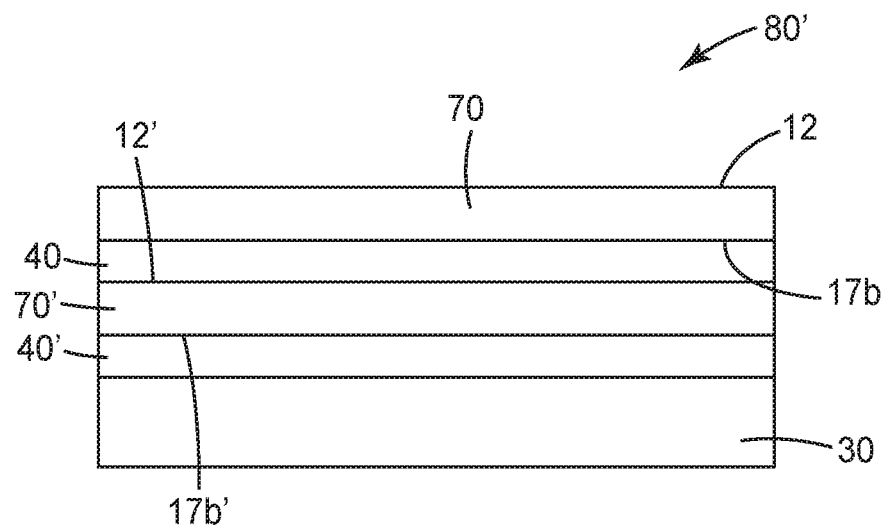
FIG. 4B is a schematic cross sectional diagram of a polishing pad in accordance with some embodiments of the present disclosure.

In some embodiments, the polishing pads of the present disclosure may include at least two polishing pads, i.e. a multi-layered arrangement of polishing pads. The polishing pads of a polishing pad having a multi-layered arrangement of polishing pads may include any of the polishing pad embodiments of the present disclosure. FIG. 4B shows polishing pad 80' having a multi-layered arrangement of polishing pads, e.g. polishing pads 70 and 70'. Polishing pad 80' includes polishing pad 70, having working surface 12 of a polishing layer, e.g. polishing layer 60, 61, 62 or 63, and second major surface 17b of a porous substrate, e.g. porous substrate 17, and second polishing pad 70', having working surface 12' and second major surface 17b', disposed between polishing pad 70 and a subpad 30. The two polishing layers may be releasably coupled together, such that, when polishing pad 70 has, for example, reached the end of its useful life or has been damaged, such that is no longer useable, polishing pad 70 can be removed from the polishing pad and expose the working surface 12' of the second polishing pad 70'. Polishing may then continue using the fresh working surface of second polishing layer. One benefit of a polishing pad having a multi-layered arrangement of polishing layers is that the down time and costs associated with pad changeover is significantly reduce. Optional axillary foam layer 40 may be disposed between polishing pad 70 and 70'. Optional axillary foam layer 40' may be disposed between polishing pad 70' and subpad 30. The optional axillary foam layers of a polishing pad having a multi-layered arrangement of polishing layers may be the same foam or different foam. The one or more optional axillary foam layers may have the same durometer and thickness ranges, as previously described for optional foam layer 40.

An adhesive layer (not shown) may be used to couple second major surface 17b of polishing pad 70 to the working surface of 12' of second polishing pad 70'. The adhesive layer may include a single layer of adhesive, e.g. a transfer tape adhesive, or multiple layers of adhesive, e.g. a double sided tape that may include a backing. If multiple layers of adhesive are used, the adhesives of the adhesive layers may be the same or different. When an adhesive layer is used to releasably couple polishing pad 70 to second polishing pad 70', the adhesive layer may cleanly release from working surface 12' of polishing pad 70' (adhesive layer remains with second major surface 17b of polish pad 70), may cleanly release from second major surface 17b of polishing pad 70 (adhesive layer remains with working surface 12' of polishing pad 70') or portions of the adhesive layer may remain on second major surface 17b of polishing pad 70 and working surface 12' of second polishing pad 70'. The adhesive layer may be soluble or dispersable in an appropriate solvent, so that the solvent may be used to aid in the removal of any residual adhesive of the adhesive layer that may remain on working surface 12' of second polishing layer 10' or, if the adhesive layer remained with working surface 12', to dissolve or disperse the adhesive of the adhesive layer to expose first surface 12' of second polishing pad 70'.

The adhesive of the adhesive layer may be a pressure sensitive adhesive (PSA). If the pressure sensitive adhesive layer includes at least two adhesive layers, the tack of each adhesive layer may be adjusted to facilitate clean removal of the adhesive layer from either second major surface 17b of polishing pad 70 or working surface 12' of second polishing pad 70'. Generally, the adhesive layer having the lower tack, with respect to the surface it is adhered to, may cleanly release from that surface. If the pressure sensitive adhesive layer includes a single adhesive layer, the tack of each major surface of the adhesive layer may be adjusted to facilitate clean removal of the adhesive layer from either second major surface 17b of polishing pad 70 or working surface 12' of second polishing pad 70'. Generally, the adhesive surface having the lower tack with respect to the surface it is adhered to, may cleanly release from that surface. In some embodiments, the tack of the adhesive layer to working surface 12' of second polishing pad 70' is lower than the tack of the adhesive layer to second major surface 17b of polishing pad 70. In some embodiments, the tack of the adhesive layer to working surface 12' of second polishing pad 70' is greater than the tack of the adhesive layer to second major surface 17b of polishing pad 70.

By releasably couple it is meant that a polishing pad, e.g. an upper polishing pad, may be removed from a second polishing pad, e.g. a lower polishing pad, without damaging the second polishing pad. An adhesive layer, particularly a pressure sensitive adhesive layer, may be able to releasable couple a polishing pad to a second polishing pad due to the adhesive layers unique peel strength and shear strength. The adhesive layer may be designed to have a low peel strength, such that a surface of a polishing pad can be easily peeled from it, yet have a high shear strength, such that under the shear stress during polishing, the adhesive will remain firmly adhered to the surface. A polishing pad may be removed from a second polishing pad by peeling the first polishing pad away from the second polishing pad.

In any of the above described polishing pads having a multi-layered arrangement of polishing pads, the adhesive layer may be a pressure sensitive adhesive layer. The pressure sensitive adhesive of the adhesive layer may include may include, without limitation, natural rubber, styrene butadiene rubber, styreneisoprene-styrene (co)polymers, styrene-butadiene-styrene (co)polymers, polyacrylates including (meth)acrylic (co)polymers, polyolefins such as polyisobutylene and polyisoprene, polyurethane, polyvinyl ethyl ether, polysiloxanes, silicones, polyurethanes, polyureas, or blends thereof. Suitable solvent soluble or dispersible pressure sensitive adhesives may include, without limitation, those soluble in hexane, heptane, benzene, toluene, diethyl ether, chloroform, acetone, methanol, ethanol, water, or blends thereof. In some embodiments the pressure sensitive adhesive layer is at least one of water soluble or water dispersible.

In any of the above described polishing pads having a multi-layered arrangement of polishing pads, which include an adhesive layer to couple the polishing pads, the adhesive layer may include a backing. Suitable backing layer materials may include, without limitation, paper, polyethylene terephthalate films, polypropylene films, polyolefins, or blends thereof.

In any of the above described polishing pads having a multi-layered arrangement of polishing pads, the working surface or second major surface of the associated porous substrate of any given polishing pad may include a release layer, to aid in the removal of a polishing pad from a second polishing pad. The release layer may be in contact with a surface of the polishing pad and an adjacent adhesive layer which is coupling the polishing pad to a second polishing pad. Suitable release layer materials may include, without limitation, silicone, polytetrafluoroethylene, lecithin, or blends thereof.

In any of the above described polishing pads having a multi-layered arrangement of polishing pads having one or more optional axillary foam layers, the axillary foam layer surface adjacent to the second major surface of the porous substrate of a polishing pad may be permanently coupled to the second major surface of the porous substrate of the polishing pad. By permanently coupled, it is meant that the axillary foam layer is not designed to be removed from the polishing pad and/or remains with the polishing pad, when the polishing pad is removed to expose the working surface of an underlying polishing pad. An adhesive layer, as previously described, may be used to releasably couple the surface of the axillary foam layer adjacent to the working surface of an adjacent, underlying polishing pad. In use, a worn polishing pad with permanently coupled axillary foam layer may then be removed from the underlying polishing pad, exposing the fresh working surface of the corresponding underlying polishing pad. In some embodiments, an adhesive may be used to permanently couple the adjacent axillary foam layer surface to the adjacent second major surface of the porous substrate of a polishing pad and the adhesive may be selected to have the desired peel strength to maintain coupling between the second major surface and adjacent axillary foam layer surface, when the polishing pad is removed from the multi-layered polishing pad arrangement. In some embodiments, the peel strength between second major surface of a polishing pad and an adjacent axillary foam layer surface is greater than the peel strength between the opposed axillary foam surface and an adjacent working surface of an adjacent underlying polishing pad, e.g. a second polishing pad.

The number of polishing pads included in a polishing pad having a multi-layered arrangement of polishing pads is not particular limited. In some embodiments the number of polishing pads in a polish pad having a multi-layered arrangement of polishing pads may be between about 2 and about 20, between about 2 and about 15, between about 2 and about 10, between about 2 and about 5, between about 3 and about 20, between about 3 and about 15, between about 3 and about 10, or even between about 3 and about 5

In one embodiment, the present disclosure provides a polishing pad comprising a polishing layer having a working surface and a second surface opposite the working surface;

wherein the working surface includes a land region and at least one of a plurality of precisely shaped pores and a plurality of precisely shaped asperities;

wherein the thickness of the land region is less than about 5 mm and the polishing layer comprises a polymer;

wherein the polishing layer includes a plurality of nanometer-size topographical features on at least one of the surface of the precisely shaped asperities, the surface of the precisely shaped pores and the surface of the land region; and at least one second polishing layer having a working surface and a second surface opposite the working surface;

wherein the working surface includes a land region and at least one of a plurality of precisely shaped pores and a plurality of precisely shaped asperities, wherein the thickness of the land region is less than about 5 mm and the polishing layer comprises a polymer; and wherein the at least one second polishing layer includes a plurality of nanometer-size topographical features on at least one of the surface of the precisely shaped asperities, the surface of the precisely shaped pores and the surface of the land region.

In another embodiment, the present disclosure provides a polishing pad comprising a polishing layer having a working surface and a second surface opposite the working surface;

wherein the working surface includes a land region and at least one of a plurality of precisely shaped pores and a plurality of precisely shaped asperities;

wherein the thickness of the land region is less than about 5 mm and the polishing layer comprises a polymer;

wherein the working surface comprises a secondary surface layer and a bulk layer; and wherein at least one of the receding contact angle and advancing contact angle of the secondary surface layer is at least about 20° less than the corresponding receding contact angle or advancing contact angle of the bulk layer; and at least one second polishing layer having a working surface and a second surface opposite the working surface;

wherein the working surface includes a land region and at least one of a plurality of precisely shaped pores and a plurality of precisely shaped asperities, wherein the thickness of the land region is less than about 5 mm and the polishing layer comprises a polymer; and wherein the working surface of the at least one second polishing layer comprises a secondary surface layer and a bulk layer; and wherein at least one of the receding contact angle and advancing contact angle of the secondary surface layer is at least about 20° less than the corresponding receding contact angle or advancing contact angle of the bulk layer.

In another embodiment, the present disclosure provides a polishing pad comprising a polishing layer having a working surface and a second surface opposite the working surface;

wherein the working surface includes a land region and at least one of a plurality of precisely shaped pores and a plurality of precisely shaped asperities;

wherein the thickness of the land region is less than about 5 mm and the polishing layer comprises a polymer;

wherein the working surface comprises a secondary surface layer and a bulk layer; and wherein the receding contact angle of the working surface is less than about 50°; and at least one second polishing layer having a working surface and a second surface opposite the working surface;

wherein the working surface includes a land region and at least one of a plurality of precisely shaped pores and a plurality of precisely shaped asperities, wherein the thickness of the land region is less than about 5 mm and the polishing layer comprises a polymer; and wherein the working surface of the at least one second polishing layer comprises a secondary surface layer and a bulk layer; and wherein the receding contact angle of the working surface of the at least one second polishing layer is less than about 50°.

In the polishing pad embodiments having a polishing layer and at least one second polishing layer, the polishing pad may further include an adhesive layer disposed between the second surface of the polishing layer and the working surface of the at least one second polishing layer. In some embodiments, the adhesive layer may be in contact with at least one of the second surface of the polishing layer and the working surface of the at least one second polishing layer. In some embodiments, the adhesive layer may be in contact with both the second surface of the polishing layer and the working surface of the at least one second polishing layer. The adhesive layer may be a pressure sensitive adhesive layer.

Figure 5:
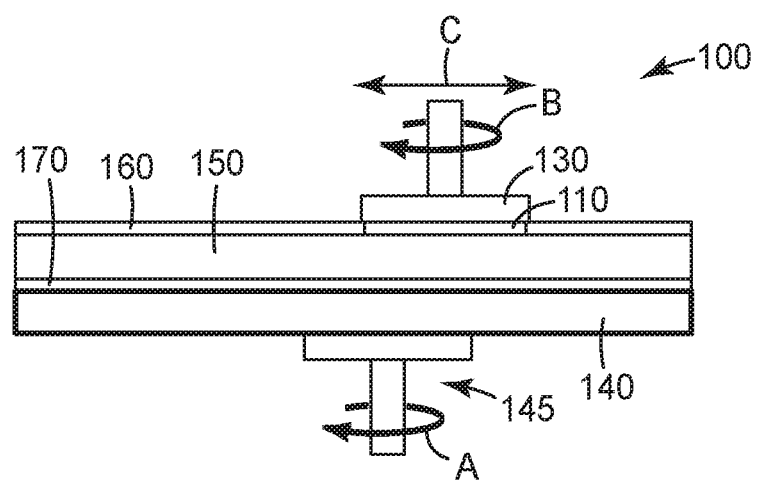
FIG. 5 illustrates a schematic diagram of an example of a polishing system for utilizing the polishing pads and methods in accordance with some embodiments of the present disclosure.

FIG. 5 schematically illustrates an example of a polishing system 100 for utilizing polishing pads and methods in accordance with some embodiments of the present disclosure. As shown, the system 100 may include a polishing pad 150 and a polishing solution 160. The system may further include one or more of the following: a substrate 110 to be polished or abraded, a platen 140 and a carrier assembly 130. An adhesive layer 170 may be used to attach the polishing pad 150 to platen 140 and may be part of the polishing system. Polishing solution 160 may be a layer of solution disposed about a major surface of the polishing pad 150. Polishing pad 150 may be any of the polishing pad embodiments of the present disclosure and includes at least one polishing layer (not shown) and at least one porous substrate (not shown), as described herein, and may optionally include a subpad and/or axillary foam layer(s), as described for polishing pads 80 and 80' of FIGS. 4A and 4B, respectively. The polishing solution is typically disposed on the working surface of the polishing layer of the polishing pad. The polishing solution may also be at the interface between substrate 110 and polishing pad 150. During operation of the polishing system 100, a drive assembly 145 may rotate (arrow A) the platen 140 to move the polishing pad 150 to carry out a polishing operation. The polishing pad 150 and the polishing solution 160 may separately, or in combination, define a polishing environment that mechanically and/or chemically removes material from or polishes a major surface of a substrate 110. To polish the major surface of the substrate 110 with the polishing system 100, the carrier assembly 130 may urge substrate 110 against a polishing surface of the polishing pad 150 in the presence of the polishing solution 160. The platen 140 (and thus the polishing pad 150) and/or the carrier assembly 130 then move relative to one another to translate the substrate 110 across the polishing surface of the polishing pad 150. The carrier assembly 130 may rotate (arrow B) and optionally transverse laterally (arrow C). As a result, the polishing layer of polishing pad 150 removes material from the surface of the substrate 110. In some embodiments, inorganic abrasive material, e.g. inorganic abrasive particles, may be included in the polishing layer to facilitate material removal from the surface of the substrate. In other embodiments, the polishing layer is substantially free of any inorganic abrasive material and the polishing solution may be substantially free of organic or inorganic abrasive particle or may contain organic or inorganic abrasive particles or combination thereof. It is to be appreciated that the polishing system 100 of FIG. 5 is only one example of a polishing system that may be employed in connection with the polishing pads and methods of the present disclosure, and that other conventional polishing systems may be employed without deviating from the scope of the present disclosure.

In another embodiment, the present disclosure relates to a method of polishing a substrate, the method of polishing including: providing a polishing pad according to any one of the previous polishing pads, wherein the polishing pad may include any of the previously described polishing layers; providing a substrate, contacting the working surface of the polishing pad with the substrate surface, moving the polishing pad and the substrate relative to one another while maintaining contact between the working surface of the polishing pad and the substrate surface, wherein polishing is conducted in the presence of a polishing solution. In some embodiments, the polishing solution is a slurry and may include any of the previously discussed slurries. In another embodiment the present disclosure relates to any of the preceding methods of polishing a substrate, wherein the substrate is a semiconductor wafer. The materials comprising the semiconductor wafer surface to be polished, i.e. in contact with the working surface of the polishing pad, may include, but are not limited to, at least one of a dielectric material, an electrically conductive material, a barrier/adhesion material and a cap material. The dielectric material may include at least one of an inorganic dielectric material, e.g. silicone oxide and other glasses, and an organic dielectric material. The metal material may include, but is not limited to, at least one of copper, tungsten, aluminum, silver and the like. The cap material may include, but is not limited to, at least one of silicon carbide and silicon nitride. The barrier/adhesion material may include, but is not limited to, at least one of tantalum and tantalum nitride. The method of polishing may also include a pad conditioning or cleaning step, which may be conducted in-situ, i.e. during polishing. Pad conditioning may use any pad conditioner or brush known in the art, e.g. 3M CMP PAD CONDITIONER BRUSH PB33A, 4.25 in diameter available from the 3M Company, St. Paul, Minn. Cleaning may employ a brush, e.g. 3M CMP PAD CONDITIONER BRUSH PB33A, 4.25 in diameter available from the 3M Company, and/or a water or solvent rinse of the polishing pad.

In another embodiment, the present disclosure provides a method for forming at least one of a plurality of precisely shaped asperities and a plurality of precisely shaped pores in a polishing layer of a polishing pad, the method includes: providing a negative master tool having negative topographical features corresponding to the at least one of a plurality of precisely shaped asperities and a plurality of precisely shaped pores; providing a molten polymer or a curable polymer precursor; coating the molten polymer or curable polymer precursor onto the negative master tool, urging the molten polymer or curable polymer precursor against the negative tooling such that the topographical features of the negative master tool are imparted into the surface of the molten polymer or curable polymer precursor; cooling the molten polymer or curing the curable polymer precursor until it solidifies forming a solidified polymer layer; removing the solidified polymer layer from the negative master tool, thereby forming at least one of a plurality of precisely shaped asperities and a plurality of precisely shaped pores in a polishing layer of a polishing pad. The polishing pad may include any one of the polishing pad embodiments disclosed herein. In some embodiments, the method for simultaneously forming a plurality of precisely shaped asperities and a plurality of precisely shaped pores in a polishing layer of a polishing pad includes wherein each pore has a pore opening, each asperity has an asperity base, and a plurality of the asperity bases are substantially coplanar relative to at least one adjacent pore opening. The dimensions, tolerances, shapes and patterns of the negative topographical features required in the negative master tool correspond, respectively, to the dimensions, tolerances, shapes and patterns of the plurality of precisely shaped asperities and the plurality of precisely shaped pores described herein. The dimensions and tolerances of the polishing layer formed by this method correspond to those of the polishing layer embodiments previously describe described herein. The dimensions of the negative master tool may need to be modified for shrinkage due to thermal expansion of the molten polymer relative to the solidified polymer or for shrinkage associated with the curing of a curable polymer precursor.

In another embodiment, the present disclosure provides a method for simultaneously forming at least one of a plurality of precisely shaped asperities and a plurality of precisely shaped pores, and at least one macro-channel in a polishing layer of a polishing pad, the method includes: providing a negative master tool having negative topographical features corresponding to the at least one plurality of precisely shaped asperities and plurality of precisely shaped pores, and negative topographical features corresponding to the at least one macro-channel; providing a molten polymer or a curable polymer precursor; coating the molten polymer or curable polymer precursor onto the negative master tool, urging the molten polymer or curable polymer precursor against the negative tooling such that the topographical features of the negative master tool are imparted into the surface of the molten polymer or curable polymer precursor; cooling the molten polymer or curing the curable polymer precursor until it solidifies forming a solidified polymer layer; removing the solidified polymer layer from the negative master tool, thereby simultaneously forming at least one of a plurality of precisely shaped asperities and a plurality of precisely shaped pores, and at least one macro-channel in a polishing layer of a polishing pad. The polishing pad may include any one of the polishing pad embodiments disclosed herein. The dimensions, tolerances, shapes and patterns of the negative topographical features required in the negative master tool correspond, respectively, to the dimensions, tolerances, shapes and patterns of the plurality of precisely shaped asperities, the plurality of precisely shaped pores and the at least one macro-channel previously described herein. The dimensions and tolerances of the polishing layer embodiments formed by this method correspond to those of polishing layer embodiments described herein. The dimensions of the negative master tool may need to be modified for shrinkage due to thermal expansion of the molten polymer relative to the solidified polymer or for shrinkage associated with the curing of a curable polymer precursor.

Select embodiments of the present disclosure include, but are not limited to, the following:

In a first embodiment, the present disclosure provides a polishing pad comprising:

a polishing layer having a working surface and a second surface opposite the working surface; wherein the working surface includes a land region and at least one of a plurality of precisely shaped pores and a plurality of precisely shaped asperities, the thickness of the land region is less than about 5 mm and the polishing layer comprises a polymer;

a porous substrate having a first major surface, an opposed second major surface and a plurality of voids; and an interfacial region wherein a portion of the polymer of the polishing layer is embedded in the at least a portion of the plurality of voids of the porous substrate.

In a second embodiment, the present disclosure provides a polishing pad according to the first embodiment, wherein the porous substrate is at least one of a film substrate having at least one of a plurality of holes and a plurality of through holes, a woven or nonwoven substrate and an open cell foam.

In a third embodiment, the present disclosure provides a polishing pad according to the first or second embodiments, wherein the porous substrate does not include an open cell foam.

In a fourth embodiment, the present disclosure provides a polishing pad according to anyone of the first through third embodiments, wherein the polishing layer further includes at least one macro-channel.

In a fifth embodiment, the present disclosure provides a polishing pad according to the fourth embodiment, wherein the interfacial region aligns, through the thickness of the polishing pad, with the at least one macro-channel.

In a sixth embodiment, the present disclosure provides a polishing pad according to anyone of the first through third embodiments, wherein the polishing layer further includes a plurality of independent macro-channels.

In a seventh embodiment, the present disclosure provides a polishing pad according to the sixth embodiment, wherein the interfacial region aligns, through the thickness of the polishing pad, with the plurality of independent macro-channels.

In an eighth embodiment, the present disclosure provides a polishing pad according to anyone of the first through third embodiments, wherein the polishing layer further includes a plurality of inter-connected macro-channels.

In a ninth embodiment, the present disclosure provides a polishing pad according to the eighth embodiment, wherein the interfacial region aligns, through the thickness of the polishing pad, with the plurality of inter-connected macro-channels.

In a tenth embodiment, the present disclosure provides a polishing pad according to any one of the first through ninth embodiments, wherein the porous substrate includes an edge seal compound that seals a least a portion of the circumference of the porous substrate.

In a eleventh embodiment, the present disclosure provides a polishing pad according to the tenth embodiment, wherein the edge seal compound seals at least about 30% of the circumference of the porous substrate.

In a twelfth embodiment, the present disclosure provides a polishing pad according to the tenth embodiment, wherein the edge seal compound seals a least about 70% of the circumference of the porous substrate.

In a thirteenth embodiment, the present disclosure provides a polishing pad according to the tenth embodiment, wherein the edge seal compound seals a least about 90% of the circumference of the porous substrate.

In a fourteenth embodiment, the present disclosure provides a polishing pad according to the tenth embodiment, wherein the edge seal compound seals a least about 95% of the circumference of the porous substrate.

In a fifteenth embodiment, the present disclosure provides a polishing pad according to the tenth embodiment, wherein the edge seal compound seals a least about 99% of the circumference of the porous substrate.

In a sixteenth embodiment, the present disclosure provides a polishing pad according to any one of the first through fifteenth embodiments, wherein the thickness of at least a portion of the interfacial region is between about 10 microns and about 5 mm.

In a seventeenth embodiment, the present disclosure provides a polishing pad according to any one of the first through sixteenth embodiments, wherein the volume of the plurality of voids of the porous substrate is at least 100% of the volume of the portion of the polymer of the polishing layer that is embedded in the at least a portion of the plurality of voids of the porous substrate.

In an eighteenth embodiment, the present disclosure provides a polishing pad according to any one of the first through seventeenth embodiments, wherein the polymer of the polishing layer comprises at least one of a thermoplastic and thermoplastic elastomer.

In a nineteenth embodiment, the present disclosure provides a polishing pad according to any one of the first through eighteenth embodiments, wherein the polishing layer includes a plurality of nanometer-size topographical features on at least one of the surface of the precisely shaped asperities, the surface of the precisely shaped pores and the surface of the land region.

In a twentieth embodiment, the present disclosure provides a polishing pad according to any one of the first through eighteenth embodiments, wherein the working surface comprises a secondary surface layer and a bulk layer; and wherein at least one of the receding contact angle and advancing contact angle of the secondary surface layer is at least about 20° less than the corresponding receding contact angle or advancing contact angle of the bulk layer.

In a twenty-first embodiment, the present disclosure provides a polishing pad according to any one of the first through eighteenth embodiments, wherein the working surface comprises a secondary surface layer and a bulk layer; and wherein the receding contact angle of the working surface is less than about 50°.

In a twenty-second embodiment, the present disclosure provides a polishing system comprising a polishing pad according to any one of the first through twenty-first embodiments and a polishing solution.

In a twenty-third embodiment, the present disclosure provides a polishing system according to the twenty-second embodiment, wherein the polishing solution is a slurry.

In a twenty-fourth embodiment, the present disclosure provides a method of polishing a substrate comprising:

providing a polishing pad according to any one of the first through twenty-first embodiments;

providing a substrate;

contacting the working surface of the polishing pad with the substrate surface;

moving the polishing pad and the substrate relative to one another while maintaining contact between the working surface of the polishing pad and the substrate surface; and wherein polishing is conducted in the presence of a polishing solution.

In a twenty-fifth embodiment, the present disclosure provides a method of polishing a substrate according to the twenty-fourth embodiment, wherein the polishing solution is a slurry.

In a twenty-sixth embodiment, the present disclosure provides a method of making a polishing pad comprising:
providing a polymer;
providing a porous substrate having a plurality of voids, the porous substrate being adjacent to the polymer;
embossing a surface of the polymer to form a polishing layer having a working surface, wherein the working surface includes a land region and at least one of a plurality of precisely shaped pores and a plurality of precisely shaped asperities; wherein the embossing forms an interfacial region having a portion of the polymer of the polishing layer embedded in the at least a portion of the plurality of voids of the porous substrate.

In a twenty-seventh embodiment, the present disclosure provides a method of making a polishing pad according to the twenty-sixth embodiment, wherein the porous substrate is at least one of a film substrate having at least one of a plurality of holes and a plurality of through holes, a woven or nonwoven substrate and an open cell foam In a twenty-eighth embodiment, the present disclosure provides a method of making a polishing pad according to the twenty-sixth or twenty-seventh embodiments, wherein the thickness of the land region is less than about 5 mm.

EXAMPLES

Test Methods and Preparation Procedures
Pad Topographic Profile Test Method

Figure 7A:
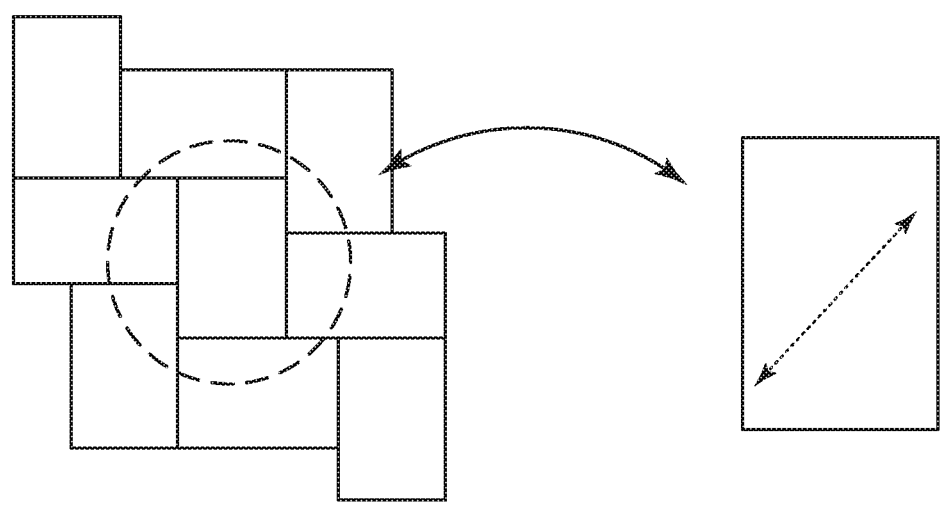
FIGS. 7A and 7B are schematic diagram defining the topographical profile measurement.
Figure 7B:
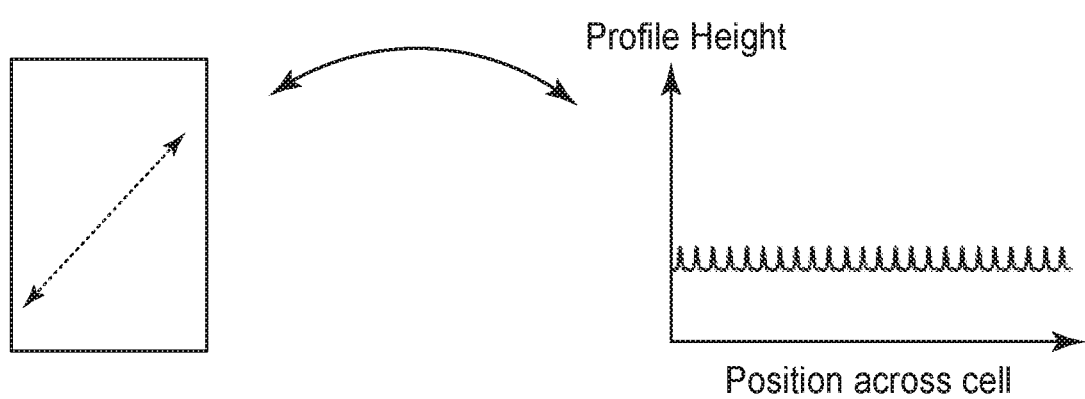

A Bruker Contour GT-X instrument was used to measure the topographic profiles of the finished pad including both heights of the asperity features as well as the planarity of the individual cells. The individual cells with asperity features were scanned using a 5× objective and instrumental software stitches individual scans together for form a topographical or height image of the pad structure. From these topographical images, individual profiles may be extracted to provide data of the pad height along any required orientation. FIG. 7a shows and individual cell element and the diagonal direction that was used to extract the profile data for sample comparisons. FIG. 7b shows hypothetical representation of profile scan across idyllic pad cell with perfect planarity. From these profile data scans, the variance of the asperity heights across the cell is tabulated to generate data representative of planarity of the individual pad cell. In the hypothetical case with perfect planarity, this variance is nil. In actual examples, this variance is a metric for the planarity quality. To get the measure of variance from the topographic images, mountain map software was used to measure heights of the first 30 asperity peaks along the diagonal profile. The range in date values (minimum to maximum) from the mountain map was used for a variance metric called planarity variance. The standard deviation of the heights of the 30 asperity peaks was also calculated and is shown in Table 1.

Pad Edge Seal Test Method

Pad samples from Example 8 were immersed in a slurry, available under the trade designation WIN W7300 Series Tungsten buff slurry, from Cabot Microelectronics, Aurora, Ill., for 24 hours and visually inspected for signs of slurry permeation into the porous substrate (nonwoven substrate) of the pad. Slurry permeation within the substrate is reported as either "no permeation", indicating no slurry in the porous substrate or "100% permeation", indicating slurry permeation throughout the entire porous substrate.

Comparative Example 1

Figure 6:
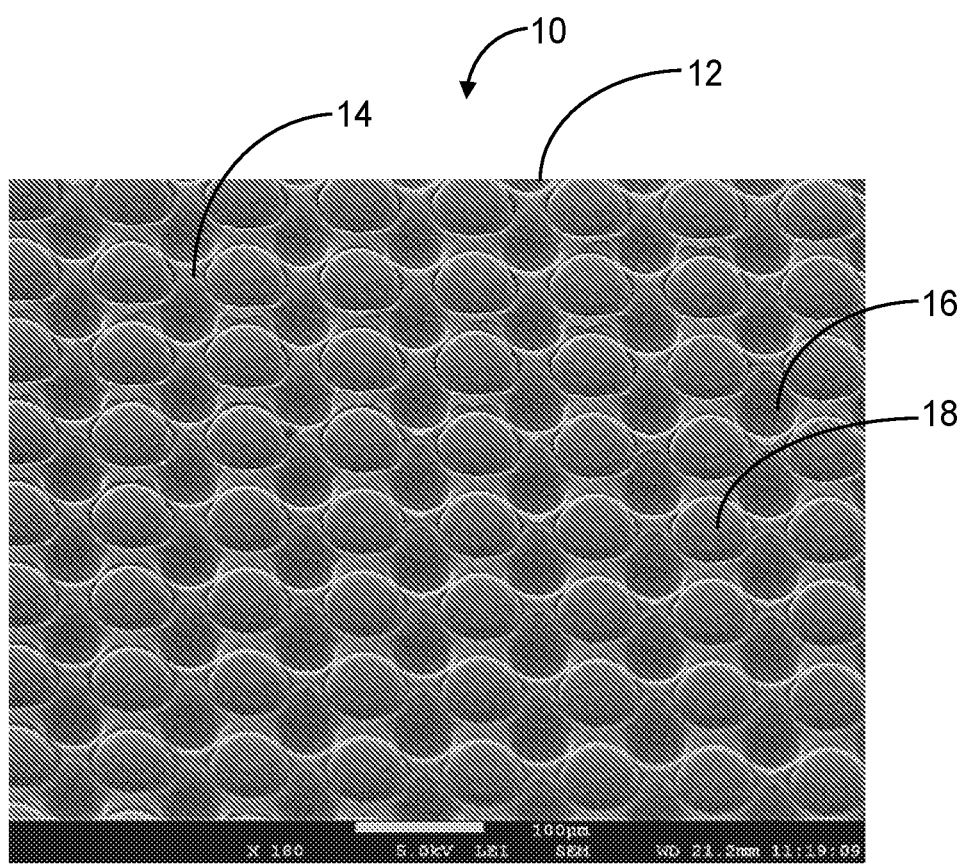
FIG. 6 is an SEM image of a portion of a polishing layer of a polishing pad in accordance with the Examples and Comparative Examples of the present disclosure.

A polishing pad having a polishing layer according to FIG. 6 was prepared as follows. A sheet of polycarbonate was laser ablated according to the procedures described in U.S. Pat. No. 6,285,001, forming a positive master tool, i.e. a tool having about the same surface topography as that required for polishing layer 10. As seen in FIG. 6, the polishing pads included in all examples of this invention include polishing layer (e.g. 10) having working surface (12) with land region (14), precisely shaped pores (16), and precisely shaped asperities (18). Asperity diameter is 50 microns and the asperity spacing is 90 microns with pore diameter of 60 microns. The resulting bearing area is approximately 24% for this example pattern. The asperity height in this case is 19 microns and pore depth is 30 microns. The polycarbonate master tool was then plated with nickel, three iterations, using conventional techniques, to form a nickel negative. A single nickel negatives, 18 inches wide, were formed in this manner and micro-welded together to make a larger nickel negative in order to form an embossing roll, about 34 inches wide. The roll was then used in an embossing process, similar to that described in U.S. Patent Application Publication No. 2010/0188751, to form a textured polishing layer, which was a thin film and which was wound into a roll. The polymeric material used in the embossing process to form the polishing layer was a thermoplastic polyurethane, available under the trade designation Irogran A95P resin available from Huntsman (Huntsman Advanced Materials, The Woodlands, Tex.). The polyurethane had a durometer of about 65 Shore D and the polishing layer had thickness of about 17 mils (0.432 mm). During the embossing process a solid PET substrate was brought into contact and adhered to the back surface the polishing layers. This comparative example uses standard solid PET film substrate in place of a porous substrate.

Example 2

Figure 8A:
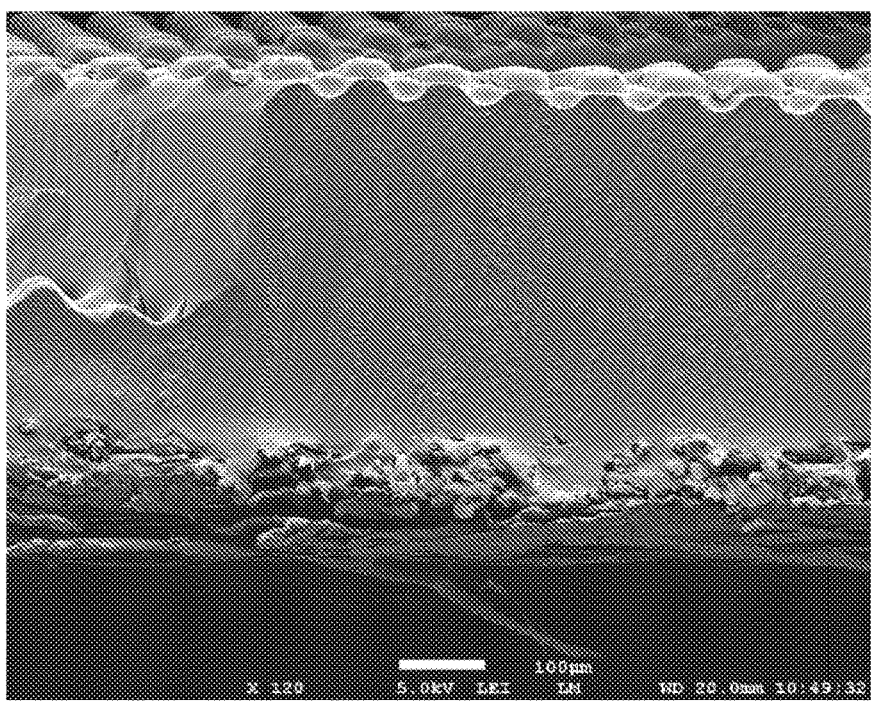
FIG. 8A is an SEM image of a cross section of a the polishing pad of Example 4
Figure 8B:
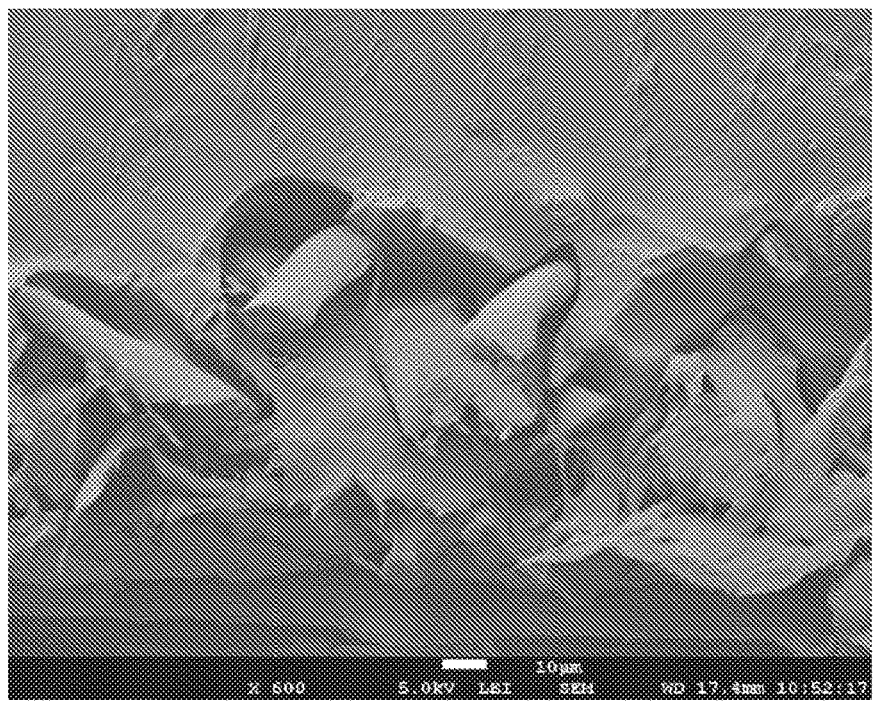
FIG. 8B is an SEM image of a cross section of the polishing pad of Example 4 with focus on the interfacial region.
Figure 9A:
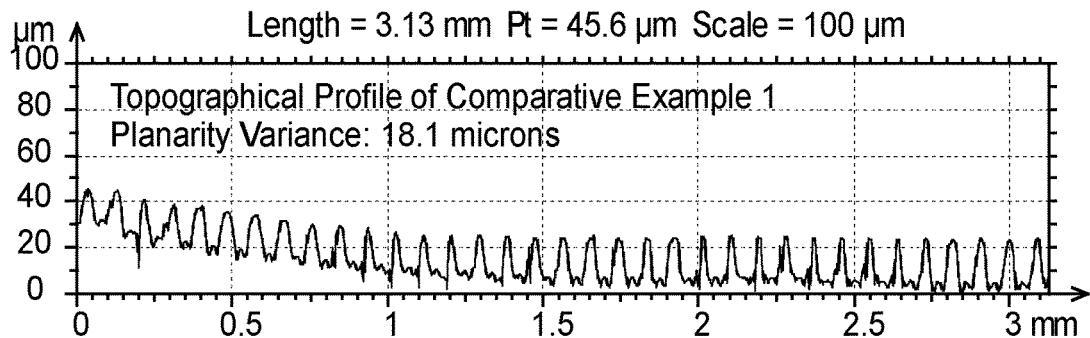
FIG. 9A shows the topographical profile date and planarity variance of Comparative Example 1.
Figure 9B:
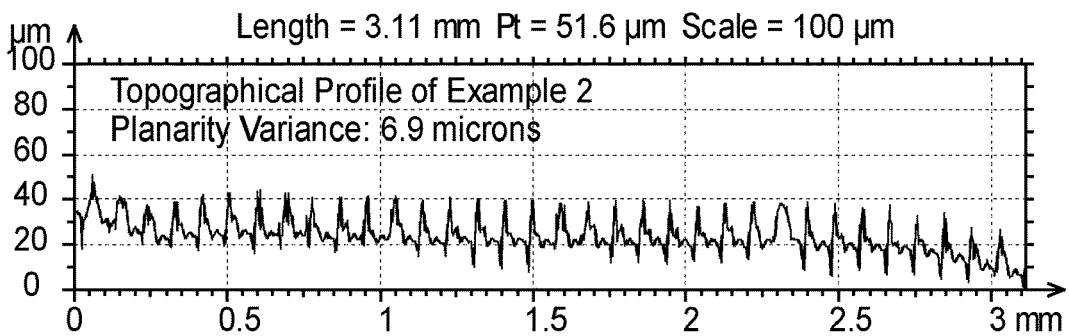
FIG. 9B shows the topographical profile date and planarity variance of Example 2
Figure 9C:
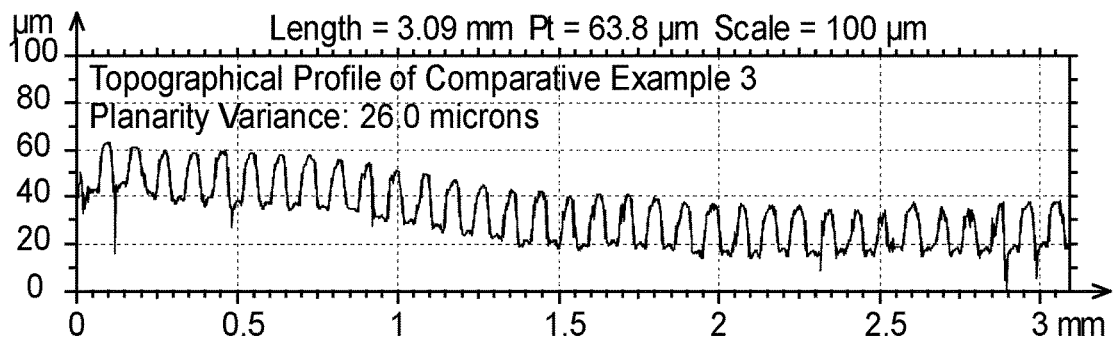
FIG. 9C shows the topographical profile date and planarity variance of Comparative Example 3.
Figure 9D:
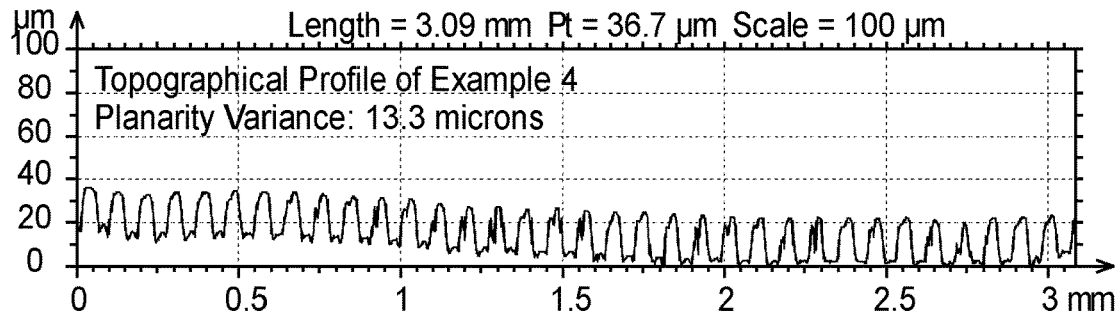
FIG. 9D shows the topographical profile date and planarity variance of Example 4.
Figure 9E:
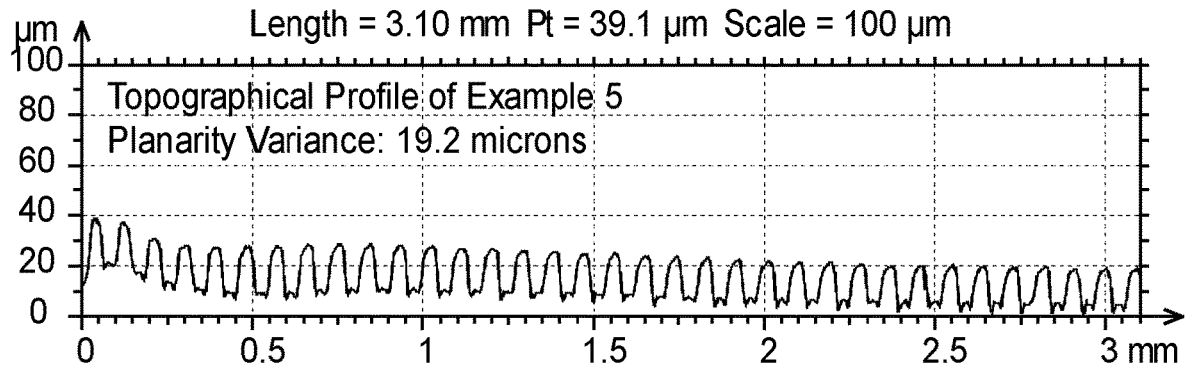
FIG. 9E shows the topographical profile date and planarity variance of Example 5.
Figure 9F:
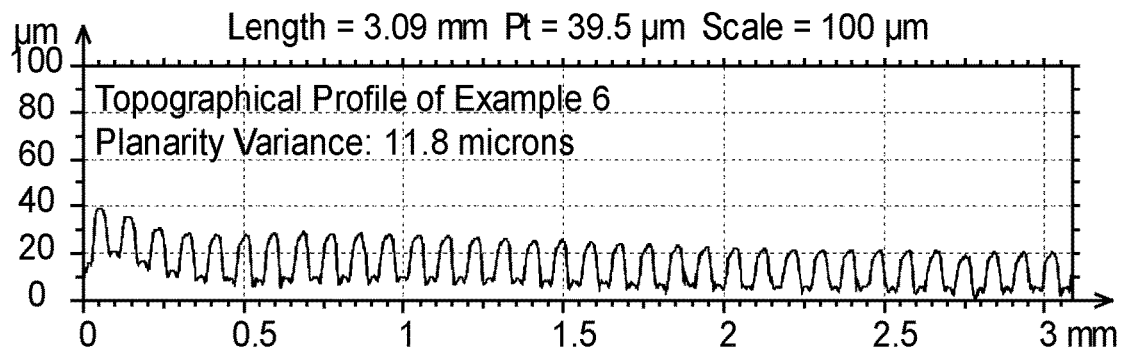
FIG. 9F shows the topographical profile date and planarity variance of Example 6.
Figure 9G:
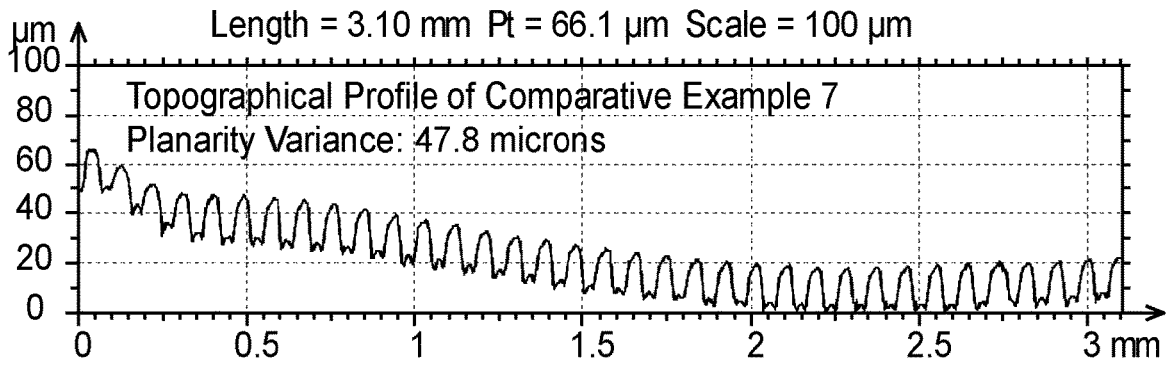
FIG. 9G shows the topographical profile date and planarity variance of Comparative Example 7.

Example 2 was prepared using the identical method and resin as Comparative Example 1, but with a solid PET film substrate replaced by a nonwoven substrate. This nonwoven material, available from PGI (Polymer Group Inc, Charlette, N.C.) as WW-229, is a PET/Pulp wetlaid material with 84.8 gsm basic weight. The resulting extrusion results in an interfacial region with resin diffusing into the nonwoven material. FIG. 8a shows SEM image of full pad cross section and FIG. 8b shows higher magnification of the interfacial region portion of the pad.

Comparative Example 3

Comparative Example 3 was prepared using the identical method as Comparative Example 1, except Desmopan 790 resin (available from Convestro, Pittsburgh, Pa. formerly Bayer MaterialScience) replaced the Irogran A95P resin.

Example 4

Example 4 was prepared similarly to Comparative Example 3, except the PET film substrate was replaced by a sheet of nonwoven material (WW-229 from PGI).

Example 5

Example 5 was prepared similarly to Comparative Example 1, except Irogran A95P resin was replaced by Estane 58277 (Lubizol Corp, Wickliffee, Ohio) and also the PET film substrate was replaced by a perforated PET film substrate. The perforated PET film substrate was patterned so as to have circular voids (i.e. through holes) regularly spaced across the web in a square array with void size of approximately 300 microns diameter and a 1 mm pitch Example 6

Example 6 was prepared in similarly to Example 5, but with the perforated PET film substrate replaced by a perforated polycarbonate film substrate. This perforated polycarbonate film substrate has 100 micron square shaped voids (i.e. though holes) in square array and a 200 micron pitch.

Comparative Example 7

Comparative Example 7 was prepared similarly to Example 5, except the perforated PET film substrate was replaced with a solid PET film substrate.

Using the "Pad Topographic Profile Test Method" described above, the planarity variance and the standard deviation of the first 30 asperities measured were determined.

TABLE 1

| Example No. | Polymer resin material | Solid or Porous Substrate | Planarity variance (microns) | Standard Deviation (microns) |
|---|---|---|---|---|
| Comparative Example 1 | Huntsman A95P | Solid PET | 18.1 | 5.2 |
| Example 2 | Huntsman A95P | PGI nonwoven | 6.9 | 1.6 |
| Comparative Example 3 | Desmopan 790 | Solid PET | 26.0 | 9.5 |
| Example 4 | Desmopan 790 | PGI nonwoven | 13.3 | 4.9 |
| Example 5 | Estane 58277 | Perforated PET | 19.2 | 3.3 |
| Example 6 | Estane 58277 | Perforated PC | 11.8 | 4.7 |
| Comparative Example 7 | Estane 58277 | Solid PET | 47.8 | 13.9 |

Table 1 compares the pad element with the resulting measurements for planarity variance and standard deviation of the first 30 asperities measured. Topographic profiles for individual cells of the polishing pads of the Examples and Comparative Examples are shown in FIGS. 9a through 9g. The improved planarity variance and standard deviation of the heights of the asperity peaks demonstrated with polishing pads that include a porous substrate results in a greater fraction of the asperity features within the same plane.

Example 8

A 30.5 inch diameter polishing pad was prepared similarly to Comparative Example 1, except the solid PET film substrate was replaced by a nonwoven substrate. This nonwoven substrate, available under the trade designation REEMAY 2295 from PGI (Polymer Group Inc, Charlotte, N.C.), was a spunbond polyester material with 2.95 osy basis weight having a thickness of 18.5 mils (0.470 mm). A subpad was laminated to the polishing pad. The subpad consisted of a foam layer and a PETg layer. The foam layer, available under the trade designation Poron 4701-60-20062004-54T-UR from Rogers Corporation, Woodstock, Conn., was laminated to the non-working surface side (non-textured side) of the polishing pad. The PETg layer; available from Crown Plastics, Plymouth, Minn., in sheet form, 0.30 inch (0.76 mm)×36 inch (91 cm)×36 inch (91 cm); was laminated to the exposed major surface of the foam layer. An adhesive, available under the trade designation 3M DOUBLE COATED TAPE 442DL from 3M Company, St. Paul, Minn., was used as the laminating adhesive for both the foam and PETg layers. Five, 4 inch (102 cm) diameter round discs were die cut from the 30.5 polishing pad having a subpad. The circumference of four of the five discs was sealed using an edge sealing solution (an edge sealing compound precursor). The edge sealing solution was prepared by dissolving polyurethane pellets, available under the trade designation PEARL STICK 46-10/12 from Lubrizol Corporation, Wickliffe, Ohio, in ethyl acetate solvent. Four sealing solutions were prepared having polyurethane concentrations of 2%, 3%, 4% and 5% by weight. The circumference of a single disc was coated with one of the edge sealing solutions, followed by drying of the solvent for 1 hour at room temperature, to form an edge seal compound that seal the porous edge of the nonwoven substrate. The fifth disc was used as a control.

Using the "Pad Edge Seal Test Method" described above, the slurry permeation into the porous substrate of each 4 inch (102 cm) diameter polishing pad disc was determined. Results are shown in Table 2.

TABLE 2

| Example 8 | % Polyurethane in Edge Seal Solution (Wt. %) | Slurry Permeation |
|---|---|---|
| Disc 1 | 2 | No Permeation. |
| Disc 2 | 3 | No Permeation. |
| Disc 3 | 4 | No Permeation. |
| Disc 4 | 5 | No Permeation. |
| Disc 5 | No edge seal compound | 100% Permeation. |

What is claimed:

1. A polishing pad comprising: a polishing layer having a working surface and a second surface opposite the working surface; wherein the working surface includes a land region and at least one of a plurality of precisely shaped pores and a plurality of precisely shaped asperities, the thickness of the land region is less than about 5 mm and the polishing layer comprises a polymer;
   a porous substrate having a first major surface adjacent the second surface of the polishing layer, an opposed second major surface and a plurality of voids, where, for at least one depth, a portion of the plurality of voids are filled with the polymer of the polishing layer and a portion of the plurality of voids are not filled with the polymer; and
   an interfacial region, the interfacial region being where the polymer of the polishing layer is embedded in the portion of the plurality of voids of the porous substrate;
   wherein the polishing layer further includes at least one macro-channel; and
   wherein the interfacial region aligns, through the thickness of the polishing pad, with the at least one macro-channel.

2. The polishing pad of claim 1, wherein the porous substrate is at least one of a film substrate having at least one of a plurality of holes and a plurality of through holes, a woven or nonwoven substrate and an open cell foam.

3. The polishing pad of claim 1, wherein the porous substrate does not include an open cell foam.

4. The polishing pad of claim 1, wherein the interfacial region aligns, through the thickness of the polishing pad, with a plurality of independent macro-channel s.

5. The polishing pad of claim 1, wherein the polishing layer further includes a plurality of inter-connected macro-channels.

6. The polishing pad of claim 5, wherein the interfacial region aligns, through the thickness of the polishing pad, with the plurality of inter-connected macro-channels.

7. The polishing pad of claim 1, wherein the porous substrate includes an edge seal compound that seals a least a portion of the circumference of the porous substrate.

8. The polishing pad of claim 7, wherein the edge seal compound seals at least about 70% of the circumference of the porous substrate.

9. The polishing pad of claim 1, wherein the polymer of the polishing layer comprises at least one of a thermoplastic and thermoplastic elastomer.

10. The polishing pad of claim 1, wherein the polishing layer includes a plurality of nanometer-size topographical features on at least one of the surface of the precisely shaped asperities, the surface of the precisely shaped pores and the surface of the land region.

11. The polishing pad of claim 1, wherein the working surface comprises a secondary surface layer and a bulk layer; and wherein at least one of a receding contact angle and an advancing contact angle of the secondary surface layer is at least about 20° less than a corresponding receding contact angle or an advancing contact angle of the bulk layer.

12. The polishing pad of claim 1, wherein the working surface comprises a secondary surface layer and a bulk layer; and wherein a receding contact angle of the working surface is less than about 50°.

13. The polishing pad of claim 1, wherein the thickness of at least a portion of the interfacial region is between about 10 microns and about 5 mm.

14. The polishing pad of claim 1, wherein the volume of the plurality of voids of the porous substrate is at least 100% of the volume of the portion of the polymer of the polishing layer that is embedded in the at least a portion of the plurality of voids of the porous substrate.

15. A polishing system comprising the polishing pad of claim 1 and a polishing solution.

16. The polishing system of claim 15, wherein the polishing solution is a slurry.

* * * * *

UNITED STATES PATENT AND TRADEMARK OFFICE
CERTIFICATE OF CORRECTION

PATENT NO. : 11,154,959 B2
APPLICATION NO. : 15/766643
DATED : October 26, 2021
INVENTOR(S) : Lehuu et al.

It is certified that error appears in the above-identified patent and that said Letters Patent is hereby corrected as shown below:

In the Claims

Column 46
Line 67, In Claim 4, delete "macro-channel s" and insert -- macro-channels --, therefor.

Column 47
Line 8, In Claim 7, delete "a least" and insert -- at least --, therefor.

Column 48
Line 13, In Claim 14, delete "wherein the volume" and insert -- wherein a volume --, therefor.
Line 15, In Claim 14, delete "the volume of the portion" and insert -- a volume of the portion --, therefor.

Signed and Sealed this
Thirty-first Day of May, 2022

Katherine Kelly Vidal
*Director of the United States Patent and Trademark Office*